(12) United States Patent
Chatterjee et al.

(10) Patent No.: US 10,978,234 B2
(45) Date of Patent: Apr. 13, 2021

(54) MAGNETIC STACK, MULTILAYER, TUNNEL JUNCTION, MEMORY POINT AND SENSOR COMPRISING SUCH A STACK

(71) Applicants: Commissariat á l'énergie atomique et aux énergies alternatives, Paris (FR); Université Grenoble Alpes, Saint Martin d'Hères (FR); Centre National de la Recherche Scientifique (CNRS), Paris (FR)

(72) Inventors: Jyotirmoy Chatterjee, Grenoble (FR); Paulo Veloso Coelho, Grenoble (FR); Bernard Dieny, Grenoble (FR); Ricardo Sousa, Grenoble (FR); Lucian Prejbeanu, Grenoble (FR)

(73) Assignees: COMMISSARIAT A L'ENERGIE ATOMIQUE ET AUX ENERGIES ALTERNATIVES, Paris (FR); UNIVERSITÉ GRENOBLE ALPES, Saint Martin d'Heres (FR); CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 65 days.

(21) Appl. No.: 16/277,260

(22) Filed: Feb. 15, 2019

(65) Prior Publication Data
US 2019/0252601 A1    Aug. 15, 2019

(30) Foreign Application Priority Data
Feb. 15, 2018    (FR) ........................ 1851302

(51) Int. Cl.
*G06F 1/16*    (2006.01)
*H01L 51/00*    (2006.01)
(Continued)

(52) U.S. Cl.
CPC ....... *H01F 10/3286* (2013.01); *G01R 33/098* (2013.01); *G11C 11/161* (2013.01);
(Continued)

(58) Field of Classification Search
CPC .......... H01F 10/30; H01F 10/135–137; H01F 10/3236; H01F 10/3286; H01L 43/10
See application file for complete search history.

(56) References Cited

U.S. PATENT DOCUMENTS 8,546,897 B2 * 10/2013 Ohmori .................. H01L 43/08
257/421
9,858,975 B1 * 1/2018 Hatcher .............. G11C 11/1655
(Continued)

FOREIGN PATENT DOCUMENTS

FR    2 976 396 A1    12/2012
WO    WO 2017/052606 A1    3/2017

OTHER PUBLICATIONS

Search Report as issued in French Patent Application No. 1851302, dated Nov. 21, 2018.
(Continued)

*Primary Examiner* — Jose R Diaz
(74) *Attorney, Agent, or Firm* — Pillsbury Winthrop Shaw Pittman LLP

(57) ABSTRACT

A magnetic stack includes a first element including a ferromagnetic layer; a second element including a metal layer able to confer on the assembly formed by the first and the second elements a magnetic anisotropy perpendicular to the plane of the layers. The first element further includes a refractory metal material, the second element being arranged on the first element.

20 Claims, 18 Drawing Sheets

(51) Int. Cl.
| | |
|---|---|
| *G06F 3/044* | (2006.01) |
| *G06F 3/041* | (2006.01) |
| *H01L 51/52* | (2006.01) |
| *H01L 27/32* | (2006.01) |
| *H01F 10/32* | (2006.01) |
| *H01L 43/10* | (2006.01) |
| *H01L 43/02* | (2006.01) |
| *H01L 27/22* | (2006.01) |
| *G11C 11/16* | (2006.01) |
| *G01R 33/09* | (2006.01) |
| *H01F 10/12* | (2006.01) |
| *H01F 41/30* | (2006.01) |
| *H01L 43/12* | (2006.01) |

(52) U.S. Cl.
CPC ...... *G11C 11/1659* (2013.01); *G11C 11/1675* (2013.01); *H01F 10/12* (2013.01); *H01F 10/3254* (2013.01); *H01L 27/224* (2013.01); *H01L 27/226* (2013.01); *H01L 43/02* (2013.01); *H01L 43/10* (2013.01); *H01F 41/302* (2013.01); *H01L 43/12* (2013.01)

(56) References Cited

U.S. PATENT DOCUMENTS 10,229,723 B1\* 3/2019 Choi ................ G11C 11/16
2020/0168262 A1\* 5/2020 Higo ................ H01L 27/228

OTHER PUBLICATIONS

Swerts, J., et al., "Top pinned magnetic tunnel junction stacks with high annealing tolerance for high density STT-MRAM applications," 2017 IEEE International Magnetics Conference, Apr. 2017, XP033140940, 1 page.

Chatterjee, J., et al. "Enhanced annealing stability and perpendicular magnetic anisotropy in perpendicular magnetic tunnel junctions using W layer," Applied Physics Letters, vol. 110, No. 20, May 2017, XP012218869, pp. 202401-1-202401-5.

Swerts, J., et al., "Solving the BEOL compatibility challenge of top-pinned magnetic tunnel junction stacks," 2017 IEEE International Electron Devices Meeting, Dec. 2017, XP033306100, pp. 38.6.1-38.6.4.

\* cited by examiner

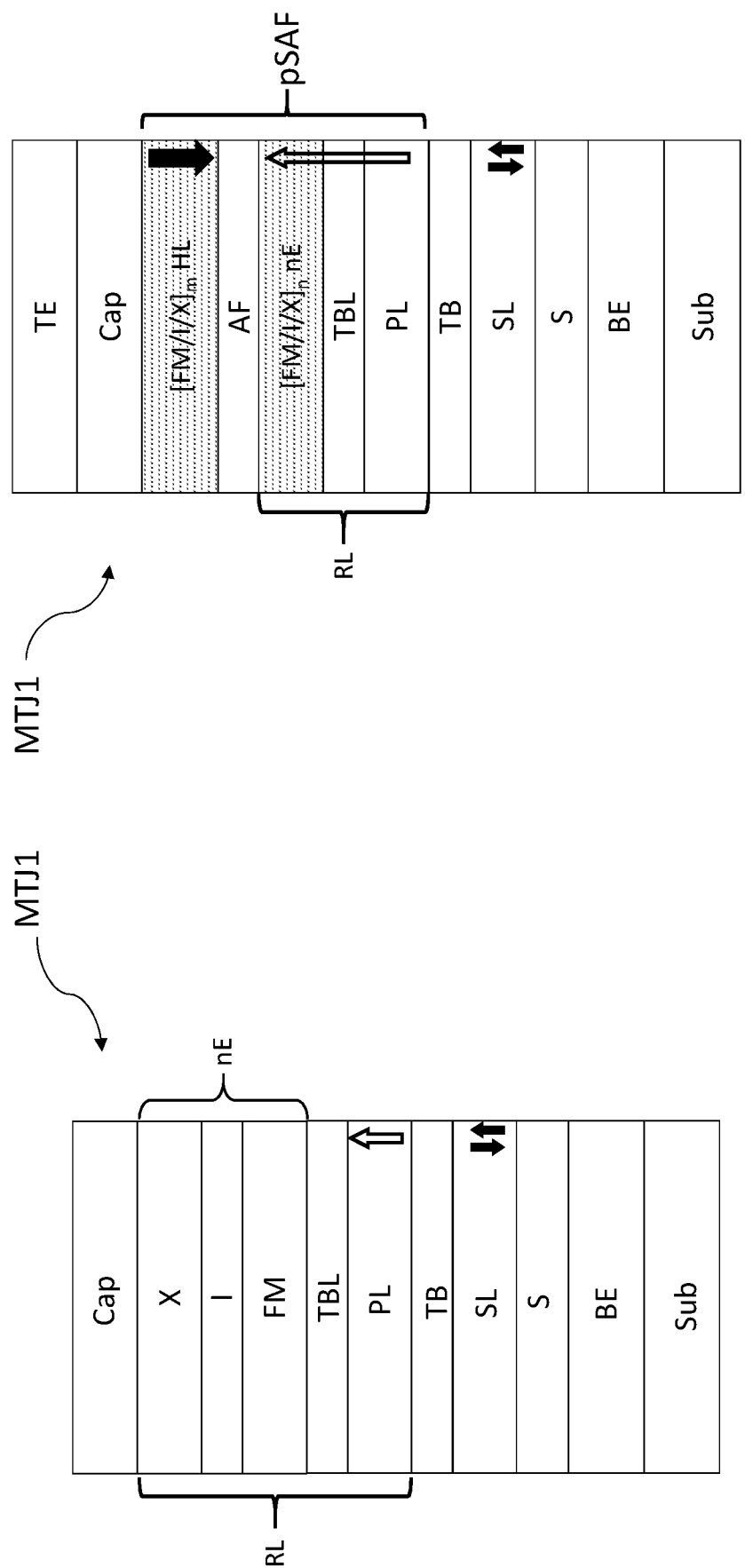

MAGNETIC STACK, MULTILAYER, TUNNEL JUNCTION, MEMORY POINT AND SENSOR COMPRISING SUCH A STACK

CROSS-REFERENCE TO RELATED APPLICATIONS

This application claims priority to French Patent Application No. 1851302, filed Feb. 15, 2018, the entire content of which is incorporated herein by reference in its entirety.

TECHNICAL FIELD OF THE INVENTION

The present invention relates to a magnetic stack with out-of-plane magnetisation. "Magnetic stack with out-of-plane magnetisation" designates a magnetic stack that has a magnetisation substantially perpendicular to the plane along which extend the stack or plane of layers. One aim of the present invention is to propose a magnetic stack not needing to be deposited on a seed layer having a predetermined crystalline symmetry to obtain a strong magnetic anisotropy outside of the plane of the layers. This magnetic stack is advantageously able to withstand temperatures that are able to be high such as in particular those of post-deposition annealings (generally at a temperature above 300° C.) without degradation of the magnetic properties, which could take place following inter-diffusion phenomena in the stack, at high temperatures. The present invention also relates to a multilayer including such a magnetic stack. The invention also relates to a magnetic tunnel junction comprising the magnetic stack or the multilayer according to the invention. The invention also relates to other spintronic devices with perpendicular magnetisation including the magnetic stack or the multilayer according to the invention:
- a memory point with at least two terminals for a memory cell and in particular three terminals notably for a writing memory cell of spin-orbit torque (or spin-orbit transfer) type;
- a double magnetic tunnel junction;
- a magnetic tunnel junction for a memory cell with several levels;
- a memory point with at least two terminals for a memory cell with several levels and in particular three or even four terminals;
- a temperature and applied external magnetic field sensor.

PRIOR ART

Magnetic tunnel junctions (MTJs) constitute a basic building block of spintronic devices.

A magnetic tunnel junction is formed by two magnetic electrodes separated by a thin layer acting as tunnel barrier. The tunnel layer is often made of MgO with a thickness comprised between 1 nm and 2 nm. One of the magnetic electrodes, called reference layer, has a fixed magnetisation thanks to a synthetic antiferromagnetic layer (SAF). The second magnetic electrode, called storage layer, has a magnetisation that can be oriented either parallel or antiparallel to the direction of magnetisation of the reference layer.

The magnetisation state of the MTJ may be read by measuring its electrical resistance, which varies according to the magnetic configuration of the two magnetic electrodes on account of the tunnel magnetoresistance phenomenon.

Thus, the configuration having magnetisations of the two layers (storage and reference) oriented parallel corresponds to a state of low resistance of the MTJ (Rmin). The configuration having magnetisations of the two layers oriented antiparallel corresponds to a state of high resistance of the MTJ (Rmax). The relative difference in resistance between the two configurations (Rmax−Rmin)/Rmin represents the amplitude of tunnel magnetoresistance which can exceed 200% at room temperature. These two magnetic states may be used to encode an information "bit".

The reversal of the magnetisation of the storage layer is realised by a current that traverses the stack along the direction perpendicular to the plane of the layers. This current is also called writing current.

For example, magnetic tunnel junctions are used as storage elements in "Spin Transfer Torque" or STT-MRAM type magnetic memories or instead in "Thermally Assisted Switching" or TAS-MRAM type magnetic memories.

A magnetic tunnel junction according to the prior art is illustrated in figure 1a. Such a magnetic tunnel junction includes:
- a substrate layer Sub;
- a bottom electrode BE;
- a growth layer S or "seed layer";
- a hard layer HL antiferromagnetically coupled to a reference layer RL by a coupling layer AF to form a synthetic antiferromagnetic layer pSAF;
- A reference layer RL formed by a pinning layer Pin, a texture breaking layer TBL and a spin polarisation layer PL;
- A tunnel barrier layer TB;
- A storage layer SL;
- A protective layer Cap;
- A top electrode TE.

The function of these different layers is explained hereafter.

The two bottom BE and top TE electrode layers make it possible to produce electrical contacts to make a current circulate normal to the plane of the layers, this current being able to be used to write or read the state of the magnetic tunnel junction. The seed layer S is used to favour a predetermined crystalline symmetry in the hard layer HL and in the pinning layer Pin. The crystalline symmetry of the seed layer S makes it possible to obtain a pinning layer Pin and a hard layer HL having a high perpendicular magnetic anisotropy to obtain a magnetisation of the reference layer that is stable over time.

The tunnel barrier layer TB separates the storage layer SL, having a variable magnetisation, and the reference layer RL, having a fixed magnetisation, and makes it possible to obtain a tunnel magnetoresistance between the two electrodes.

The hard layer HL is antiferromagnetically coupled to the reference layer RL by the layer AF, the antiferromagnetic coupling making it possible to increase the magnetic coercivity and thus the magnetic stability of the stack pSAF and to reduce the parasitic field exerted by the reference layer on the storage layer.

In most magnetic tunnel junctions MTJs, the magnetisation is out-of-plane, namely perpendicular to the plane of the layers. These stacks are also called perpendicular magnetic tunnel junctions or pMTJs. Such an orientation makes it possible to find a good com promise between the thermal stability of the magnetisation of the storage layer that defines the retention of the memory and the writing current intensity. In pMTJs the reference layer RL must have a strong perpendicular magnetic anisotropy, so as to keep a stable magnetisation throughout the lifetime of the device. To this end, the reference layer RL includes a polarisation layer PL coupled to a pinning layer Pin having a strong perpendicular magnetic anisotropy, the coupling being realised by a layer including boron. The pinning layer Pin may be a multilayer formed by a repetition of bilayers of FM/X type. FM is here taken to mean a ferromagnetic layer including for example one of the following materials Co, Fe, CoFe or an alloy of these materials. X is taken to mean a magnetic or non-magnetic metal layer including for example one of the following materials: Pt, Au, Ir, Pd, Ni, NiCo, NiFe, NiFeCo or an alloy of these materials. The notation [FM/X]$_n$ is taken to mean a superimposition of n FM/X bilayers. The polarisation PL and pinning Pin layers may produce a parasitic field that perturbs the magnetisation of the storage layer SL. To reduce this effect a layer with fixed magnetisation or hard layer HL is used. The hard layer HL is characterised by a high coercive field. The hard layer HL is antiferromagnetically coupled to the pinning layer Pin. The antiferromagnetic coupling is realised thanks to the coupling layer AF including one of the materials Ru, Re, Rh, Ir, Os or an alloy of these materials. As is well known to those skilled in the art, it is necessary to control precisely the thickness of this coupling layer AF to obtain antiferromagnetic coupling. For example, for an antiferromagnetic coupling layer made of Ru, a thickness comprised between 0.3 and 0.9 nm must be used. The hard layer HL is itself also constituted of a repetition of bilayers of FM/X type, with a high perpendicular magnetic anisotropy. The assembly of layers formed by the hard layer, the antiferromagnetic coupling layer, the pinning layer, the texture breaking layer and the polarisation layer is also called synthetic antiferromagnetic layer with perpendicular anisotropy pSAF.

There exist two types of magnetic tunnel junctions with perpendicular magnetisation pMTJs, illustrated in FIG. 1. FIG. 1a shows an example of pMTJs in which the synthetic antiferromagnetic element with perpendicular magnetisation pSAF lies below the tunnel barrier. In this type of magnetic tunnel junction the storage layer SL lies above the tunnel barrier, hence the denomination of "top storage pMTJ" or TS-pMTJ. FIG. 1b shows an example of pMTJs in which the synthetic antiferromagnetic element with perpendicular magnetisation pSAF lies above the tunnel barrier. In this type of junction the storage layer lies below the tunnel barrier TB, hence the denomination of "bottom storage pMTJ" or BS-pMTJ.

A magnetic tunnel junction of BS-pMTJ type makes it possible to have a more regular surface for the growth of the storage layer and the tunnel barrier. In addition, a magnetic tunnel junction of BS-pMTJ type may be used in the manufacture of magnetic random access memories of spin-orbit torque or SOT-MRAM (Spin Orbit Torque Magnetic Random Access Memory) type. Indeed, in a SOT-MRAM type memory, the storage layer must be in contact with a metal strip placed below the magnetic tunnel junction. In a tunnel junction of SOT-MRAM type the storage layer must thus lie at the base of the junction.

As illustrated in FIG. 1b, the manufacture of a magnetic tunnel junction of SOT-MRAM type requires the growth of a synthetic antiferromagnetic element pSAF having high perpendicular magnetic anisotropy directly above the tunnel barrier. In other words, the growth of the element pSAF cannot be carried out above a seed layer having a symmetry opportunely chosen to favour high perpendicular magnetic anisotropy.

In a tunnel junction of BS-pMTJ type, it is thus impossible to obtain the desired crystalline structure using a seed layer having a given symmetry. On the other hand, the perpendicular synthetic antiferromagnetic element pSAF must be produced directly in contact with the tunnel barrier to be able to produce the tunnel magnetoresistance effect enabling the reading of the magnetic state of the junction.

These difficulties greatly limit the production of SOT-MRAM type memories having high perpendicular magnetic anisotropy and their use in spintronic devices.

According to the patent application FR 2976396, it is possible to increase the perpendicular magnetic anisotropy of a FM/X type stack thanks to the addition of an intermediate layer I between the ferromagnetic layer FM and the non-ferromagnetic layer X, I being a material not very miscible with the layer FM.

However, these known magnetic stacks have a thermal stability that is not satisfactory. Indeed, they may lose their perpendicular anisotropy at annealing temperatures of the order of 300° C., which are too low compared to those required for an integration using CMOS (Complementary Metal Oxide Semiconductor) technology, which requires annealings at 400° C.

Furthermore, the materials I disclosed in the document FR2976396 do not make it possible to have interfaces between the different layers of the FM/I/X stack that are sufficiently smooth and regular. Furthermore, these materials do not make it possible to avoid interfacial defects, notably those created during the growth of the layers X, often composed of heavy metals such as Pt or Pd.

TECHNICAL PROBLEM

Magnetic stacks having strong perpendicular magnetic anisotropy are today mainly obtained by deposition on top of a seed layer having a crystalline structure opportunely chosen to favour perpendicular magnetic anisotropy.

In certain applications, such as magnetic tunnel junctions of BS-pMTJ type, it is not possible to use such a seed layer because the magnetic stack must be deposited above the tunnel barrier. In such cases, it is impossible to obtain magnetic stacks having strong perpendicular magnetic anisotropy using the stacks known in the prior art.

SUMMARY OF THE INVENTION

To resolve at least partially the aforementioned problems, the present invention relates to a magnetic stack having strong perpendicular magnetic anisotropy and which does not need to be deposited on a seed layer having a predefined crystalline structure.

To this end, the invention relates to a magnetic stack including:
  A first element including a ferromagnetic layer;
  A second element including a metal layer able to confer on an assembly formed by the first and the second elements a magnetic anisotropy perpendicular to the plane of the layers,
the magnetic stack being characterised in that the first element further includes a refractory metal material, the second element being arranged on the first element.

Magnetic stack is taken to mean a stack of layers, with at least one layer having magnetic properties.

First element including a ferromagnetic layer is taken to mean an element of the magnetic stack including one layer or two superimposed layers, at least one of the two layers being ferromagnetic.

The second element constituted of a metal layer will be indiscriminately called second element or second layer or simply metal layer.

Refractory metal material is taken to mean a metal having a melting temperature above 1600° C. and preferably above 1900° C. at the pressure of 1 bar.

Generally speaking, the magnetic stack according to the invention is of the type ferromagnetic layer FM/metal layer X in the presence of a refractory metal material.

The metal layer is constituted of a metal material able to confer on the assembly formed by the first magnetic element and the second layer a perpendicular magnetic anisotropy of interfacial origin.

For example, the first element includes one or more materials taken from a first group of materials, said first group of materials being constituted of the following materials: cobalt, iron, nickel and magnetic alloys based on these materials.

The second element includes one or more materials taken from a second group of materials, said second group of materials being constituted of the following materials: platinum, gold, iridium, palladium, nickel, NiCo, NiFe, NiFeCo and alloys based on these materials.

The refractory metal material may take the form of an insertion layer I separating the ferromagnetic layer and the second metal layer, the magnetic stack according to the invention then having the form ferromagnetic layer FM/insertion layer I/second metal layer X or FM/I/X. Alternatively, the first element may include a single layer formed by an alloy of one of the materials of the first group and of a refractory metal material.

The magnetic stack according to the invention makes it possible to obtain a thermal stability and a higher perpendicular magnetic anisotropy than stacks known in the prior art.

This is possible thanks to the use, in the first element of the magnetic stack, of a refractory metal material having a high melting temperature. Such a high melting temperature reflects the fact that the atoms of the refractory material have strong chemical bonds and which resist during the step of deposition of the second element or second layer X. Thanks to the use of the refractory metal it is thus possible to reduce the interface defects created during the growth of the second layer. When it is used as insertion layer, the refractory material further makes it possible to smooth the interfaces between the first layer and the second layer so as to increase the perpendicular magnetic anisotropy at the interface. Furthermore, the insertion of layers of refractory metal makes the whole of the stack mechanically rigid, which has the effect of increasing its stability during potential annealings at high temperature such as 400° C.

In addition, the insertion layer may reduce the magnetisation of the stack and thus reduce the demagnetising energy. This produces an effective increase in the perpendicular magnetic anisotropy.

Thanks to this set of properties, the magnetic stack according to the invention makes it possible to obtain good perpendicular magnetic anisotropy without need of a seed layer having a texture opportunely chosen to favour perpendicular magnetic anisotropy.

The magnetic stack according to the invention may thus be arranged on several types of support layers.

It follows that the magnetic stack according to the invention may be used in spintronic devices that are not compatible with the presence of a seed layer having a defined texture, for example a BS-pMTJ type magnetic tunnel junction.

In addition, thanks to the use of a refractory metal material having a high melting temperature, the magnetic stack according to the invention has greater thermal stability. In particular, thanks to the mechanical rigidity of the refractory materials the magnetic stack remains stable up to 425° C.

The magnetic stack according to the invention may also have one or more of the following characteristics, taken individually or according to all technically possible combinations thereof:

the ferromagnetic layer of the first element includes one or more materials taken from a first group of materials, said first group of materials being constituted of the following materials: cobalt, iron, nickel and magnetic alloys based on these materials;

the metal layer of the second element includes one or more materials taken from a second group of materials, said second group of materials being constituted of the following materials: platinum, gold, iridium, palladium, nickel, NiCo, NiFe, NiFeCo and alloys based on these materials;

the ferromagnetic layer of the first element includes an alloy of one or more materials taken from the first group of materials and of a refractory metal material;

the first element includes a first layer of the first element and a second layer of the first element, the first layer of the first element including one or more materials taken from the first group of materials and the second layer of the first element being constituted of the refractory metal material;

the refractory metal material is taken from the following group: tantalum, tungsten, molybdenum, ruthenium, zirconium, vanadium, niobium;

the refractory metal material has a melting temperature above 1600° C., said melting temperature being measured at the pressure of 1 bar;

the second layer of the first element has a thickness comprised between 0.1 and 0.6 nm;

the second layer of the first element has a thickness comprised between 0.2 and 0.4 nm.

The present invention also relates to a multilayer including at least a first and a second magnetic stack according to the invention, the multilayer having an out-of-plane magnetisation, the first element of the second magnetic stack being arranged on the second element or second layer of the first magnetic stack.

The present invention also relates to a magnetic tunnel junction including:

A first magnetic multilayer designated reference layer;

A second magnetic multilayer designated storage layer;

A tunnel barrier layer which separates the reference layer and the storage layer;

the reference layer including a magnetic stack or a multilayer according to the invention.

Reference layer is taken to mean a magnetic multilayer including a pinning layer, a texture breaking layer and a spin polarisation layer. The magnetisation of the reference layer is fixed and perpendicular to the plane of the layers.

Storage layer is taken to mean a magnetic monolayer or multilayer having a magnetisation perpendicular to the layer plane, the orientation of the magnetisation of the storage layer being modifiable by an opportunely chosen writing method.

According to an alternative, in the magnetic tunnel junction according to the invention the tunnel barrier layer is placed above the storage layer to produce a magnetic tunnel junction of BS-pMTJ type.

Advantageously, this type of magnetic tunnel junction is particularly suited to a SOT-MRAM type memory cell.

The invention also relates to a memory point with two or three terminals including:
- A top electrode in contact with a first terminal;
- A magnetic multilayer designated reference layer including at least one magnetic stack or a multilayer according to the invention;
- A magnetic multilayer designated storage layer;
- A tunnel barrier layer separating the reference layer and the storage layer;
- A second terminal in electrical contact with the storage layer or a metal line electrically connected to a second and third terminal, placed below the storage layer and in electrical contact with the storage layer.

Such a memory point with three terminals is particularly suited to memory cells of SOT-MRAM type or to so-called "racetrack" or shift register memories.

According to an alternative of the memory point with three terminals according to the invention, the metal line is an antiferromagnetic metal line, the writing of the storage layer then taking place by propagation of the walls of magnetic domains.

According to an alternative of the memory point with three terminals, the storage layer has a "racetrack" or shift register type geometry.

The present invention also relates to a memory point with three terminals including:
- A top electrode connected to a first terminal;
- A first magnetic multilayer designated reference layer including at least one magnetic stack according to the invention or a multilayer according to the invention;
- A magnetic multilayer designated storage layer, a second and a third terminal being connected to said storage layer;
- A tunnel barrier layer separating the reference layer and the storage layer.

In this case the electrical contacts are directly connected to the storage layer.

The invention also relates to a double magnetic tunnel junction including:
- A first magnetic multilayer designated first reference layer;
- A second magnetic multilayer designated first storage layer;
- A third magnetic multilayer designated second reference layer including a magnetic stack or a magnetic multilayer according to the invention;
- A first tunnel barrier layer separating the first reference layer and the storage layer;
- A second tunnel barrier layer separating the second reference layer and the storage layer.

The invention also relates to a magnetic tunnel junction for a memory cell with several levels including:
- A first magnetic multilayer designated first storage layer;
- A second magnetic multilayer designated first reference layer including a magnetic stack or a magnetic multilayer according to the invention;
- A first tunnel barrier layer separating the first reference layer and the first storage layer;
- A third magnetic multilayer designated second reference layer;
- A fourth magnetic multilayer designated second storage layer;
- A second tunnel barrier layer separating the second reference layer and the second storage layer.

The invention also relates to a memory point with three terminals for a memory cell with several levels including:
- A metal line connected to a second and a third terminal;
- A first magnetic multilayer designated first storage layer placed above the metal line and in contact with said metal line;
- A second magnetic multilayer designated first reference layer including a magnetic stack or a magnetic multilayer according to the invention;
- A third magnetic multilayer designated second reference layer;
- A fourth magnetic multilayer designated second storage layer;
- A top electrode connected to a first terminal.

The invention also relates to a memory point with four terminals for a memory cell with several levels including:
- A first metal line connected to a first and to a second terminal;
- A first magnetic multilayer designated first storage layer placed above the first metal line and in contact with said first metal line;
- A second magnetic multilayer designated first reference layer including a magnetic stack or a magnetic multilayer according to the invention;
- A first tunnel barrier layer separating the first storage layer and the first reference layer;
- A third magnetic multilayer designated second reference layer;
- A fourth magnetic multilayer designated second storage layer;
- A second metal line connected to a third and to a fourth terminal, said second metal line being placed above the second storage layer and in contact with said second storage layer;
- A second tunnel barrier layer separating the second storage layer and the second reference layer.

The present invention also relates to a sensor for the measurement of an applied magnetic field including:
- A top electrode connected to a first terminal;
- A first magnetic multilayer designated reference layer including a magnetic stack or a magnetic multilayer according to the invention;
- A second magnetic multilayer designated detection layer having a magnetisation oriented parallel to the plane of the layers in the absence of applied magnetic field;
- A tunnel barrier layer separating the detection layer (Sen) and the reference layer;
- At least one second terminal connected to the detection layer.

According to an alternative, the sensor according to the invention is suited for the measurement of an applied magnetic field and the temperature and further includes a metal line connected to a second and to a third terminal, said metal line being below the detection layer and in contact with said detection layer.

LIST OF FIGURES

Other characteristics and advantages of the invention will become clear on reading the description that follows, while referring to the appended figures, which illustrate:

FIG. 2b shows a multilayer according to the invention including at least two stacks according to FIG. 2a;

FIG. 3a shows a magnetic tunnel junction including a multilayer according to FIG. 2b;

FIG. 3b shows a second embodiment of the magnetic tunnel junction according to FIG. 3a;

DETAILED DESCRIPTION OF THE INVENTION

Figure 1B:
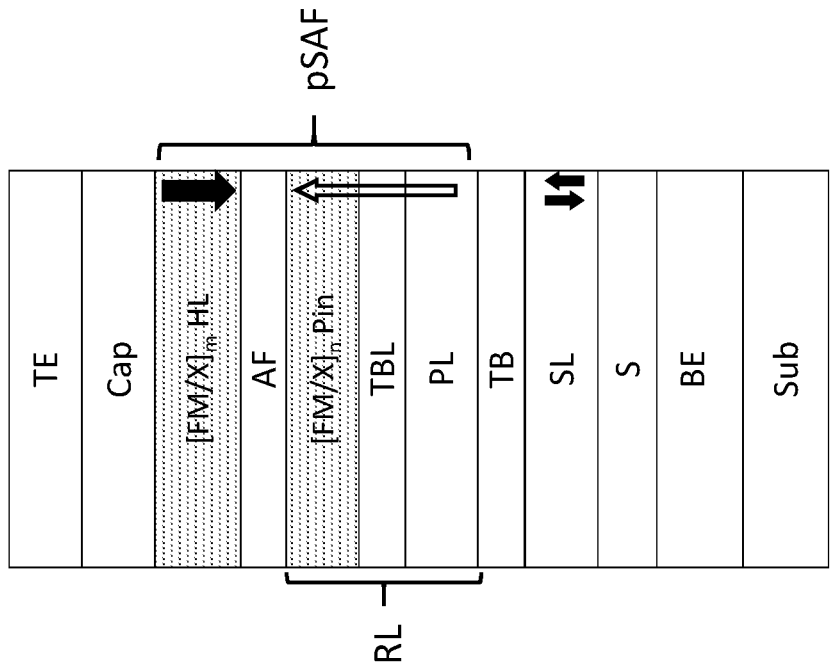
FIG. 1a and FIG. 1b show two magnetic stacks according to the prior art and corresponding to a magnetic tunnel junction with a reference layer respectively below and above the tunnel barrier.
Figure 1A:
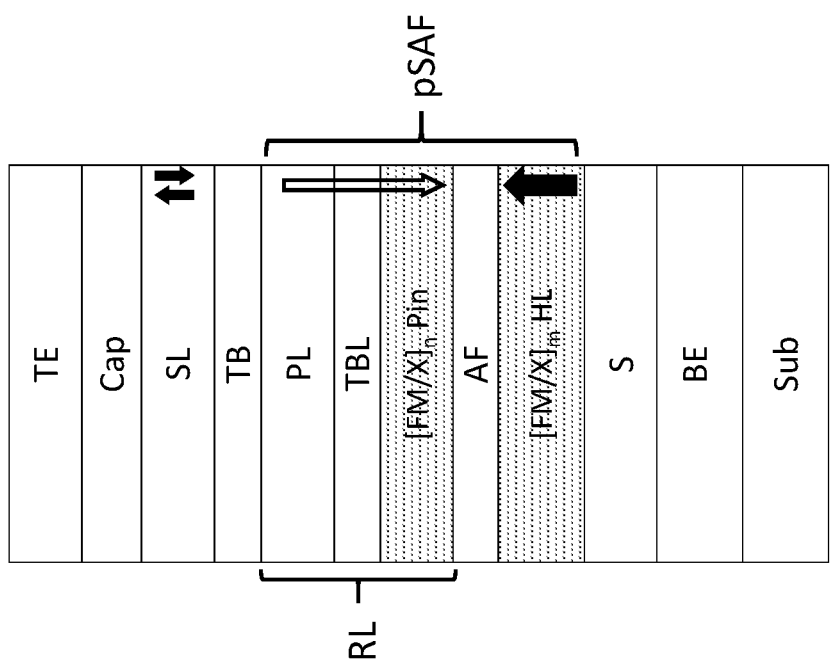
Figure 2B:
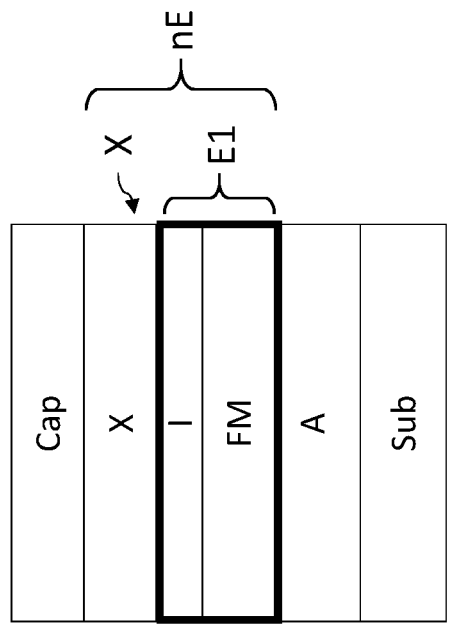
Figure 2A:
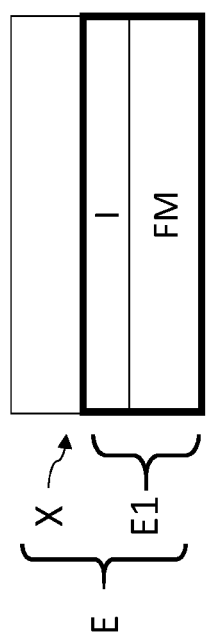
FIG. 2a shows a magnetic stack according to the invention.

FIG. 2a shows an example of magnetic stack E according to the invention. The magnetic stack E according to the invention includes a first element E1 and a second element or second layer X, the second layer X being placed above the first element E1. The first element E1 may be a bilayer as is illustrated in FIG. 2a. In this case, the first element E1 includes a first layer FM and a second layer I of the first element. The first layer FM of the first element E1 is a ferromagnetic layer including at least one of the materials belonging to the first group of materials. The first group of materials includes the following materials: cobalt, iron, nickel and magnetic alloys based on these materials. The second element is here arranged directly on the first element.

The second layer I of the first element E1, also called insertion layer I, is a layer constituted of a refractory metal. The melting temperature of the second layer I of the first element E1 is above 1600° C. and preferably above 1900° C.

According to another embodiment not represented in FIG. 2a, the first element E1 comprises a single layer constituted of an alloy of a material comprised in the first group of materials and of a refractory metal.

The magnetic stack E according to the invention further includes a second element or second layer X deposited on the first element E1. The second layer X includes at least one of the materials belonging to the second group of materials. The second group of materials includes the following materials: Pt, Au, Ir, Pa, Ni, NiCo, NiFe, NiFeCo and alloys based on these materials.

The second layer I of the first magnetic element is a layer having several aims:
  to avoid the formation of defects in the layer FM during the deposition of the layer X often made of heavy materials such as Pt or Pd;
  to make it possible to obtain an interface of low roughness between the layer FM and X, which has the effect of increasing the perpendicular anisotropy of the stack E;
  to reduce the saturation magnetisation of the layer of material FM, which contributes to increasing the effective perpendicular anisotropy;
  to improve the structural stability of the whole of the stack during potential annealings at high temperature such as 400° C. thanks to the mechanical rigidification introduced by the insertion of the refractory layer I.

Examples of refractory metals for the second layer I of the first element E1 are: tantalum, tungsten, molybdenum, ruthenium, zirconium, vanadium, niobium.

According to the embodiment illustrated in FIG. 2a, the magnetic stack according to the invention has a FM/I/X type structure.

It is important to note that the materials used for the insertion layer I according to the invention have higher melting temperatures than the other metal insertion layers known in the prior art. For example, the metals disclosed in the patent application FR 2976396 have melting temperatures of the order of 1000° C. or below. Such materials are not considered refractory materials within the meaning of the present application.

FIG. 2b shows a multilayer including:
  A substrate layer Sub;
  An adhesion layer A;
  A multilayer nE formed by magnetic stacks E according to FIG. 2a;
  A protective layer Cap.

The multilayer nE is obtained by superimposing at least two stacks E according to the invention. During the superimposition, the first element E1 of a second magnetic stack E according to the invention is deposited on the second layer X of a first stack E according to the invention.

In the example illustrated in FIG. 2b, the multilayer nE is deposited on a conductive adhesion layer A. The conductive adhesion layer A may be made of Ta with a thickness comprised between 3 and 5 nm. The Ta may be replaced by any other material able to provide good adhesion with the substrate Sub and retain an upper interface of low roughness.

The layer A may also have the role of bottom electrode to produce an electrical contact at the base of the structure. Alternatively, such a bottom electrode may be made of CuN, TiN, TaN or Ru. The bottom electrode may also be a multilayer formed by the repetition of a CuN/Ta bilayer.

To improve the magnetic properties of the multilayer nE according to the invention, the surface roughness of this layer may be reduced by chemical mechanical planarization followed by light etching of the superficial layer.

The layer A or the bottom electrode may be placed on a substrate layer Sub.

To prevent oxidation of the multilayer nE according to the invention, a protective layer Cap is deposited on the second layer X. The protective layer Cap may be also used as upper electrical contact.

According to one embodiment, the ferromagnetic layer of the first element E1 is made of Cu. However the layer Fm may also include CoFe, Fe, Ni or an alloy of these materials. The layer FM may also include a non-magnetic element such as CR, V, B or Zr.

The second layer X of the magnetic stack E according to the invention may include one of the following materials: Pt, Pd, Ru, Au, Ir, Ni, NiCo, NiFe or a combination of these materials.

The second layer I of the first element E1 is constituted of a refractory metal such as Ta, W, Ru, Mo, Nb, V, Zr or a combination of these materials. The melting temperatures of these materials are respectively 3020° C., 3422° C., 2334° C., 2623° C., 2469° C., 1910° C., 1855° C. These melting temperatures are measured at the pressure of 1 bar.

When the first element E1 is a monolayer, it is an alloy composed of one of the ferromagnetic materials given above and of a refractory metal such as Ta, Mo, W, Ru, Nb, V or Zr.

FIG. 3a shows a magnetic tunnel junction MTJ1 according to the invention including:
A substrate layer Sub;
A bottom electrode layer BE;
A seed layer S;
A storage layer SL;
A tunnel barrier layer TB, preferably made of MgO;
A spin polarisation layer PL, preferably made of FeCoB;
A texture breaking layer, TBL;
A multilayer nE according to the invention;
A protective layer Cap.

The spin polarisation layer PL, the texture breaking layer TBL and the multilayer nE according to the invention form the reference layer RL. The reference layer RL may also be considered as a top magnetic electrode. The tunnel barrier layer separates the reference layer RL and the storage layer SL. The storage layer SL may be a magnetic monolayer or multilayer.

The storage layer SL is preferably made of CoFeA, A being an amorphising element for example B, Zr or Nb. The storage layer SL is located above the seed layer S, which absorbs the amorphising element A during the annealing at a temperature comprised between 250° C. and 450° C. When a tunnel barrier BT made of MgO is used, the annealing induces a recrystallisation of the storage layer SL. On account of this recrystallisation the storage layer made of amorphous CoFeA transforms into CoFe having centred cubic symmetry (bcc).

Placed above the tunnel barrier, the upper magnetic electrode or reference layer RL is formed by a spin polarisation layer PL made of CoFeB, a texture breaking layer TBL and the multilayer nE according to the invention. As is known in the prior art, the texture breaking layer TBL ensures the structural transition between the crystalline structure bcc of the polarisation layer PL after annealing and the crystalline structure fcc of the multilayer nE according to the invention.

In particular, the multilayer nE does not need to be in contact with a seed layer S to retain a stable magnetisation oriented out-of-plane of the layers throughout the lifetime of the device. This is possible thanks to the strong perpendicular magnetic anisotropy specific to the multilayer nE according to the invention. The multilayer nE may thus be inserted in a reference layer above the tunnel barrier BT and used in a magnetic tunnel junction of "bottom storage" or BS-pMTJ type such as that illustrated in FIG. 3a.

Advantageously, a magnetic tunnel junction BS-pMTJ may be used to produce a SOT-MRAM type memory point, in which the storage layer SL must be near to the bottom electrode.

According to an alternative of the magnetic tunnel junction MTJ1 according to the invention, the reference layer RL may be inserted in a perpendicular synthetic antiferromagnetic element pSAF as illustrated in FIG. 3b. In this case an antiferromagnetic coupling layer AF such as that represented in FIG. 3b is used. This coupling layer AF may be made of Ru with a thickness comprised between 0.3 nm and 0.9 nm. A second stack nE of $(FM/I/X)_m$ type according to the invention is placed above the coupling layer and covered by a protective layer Cap. A top electrode layer TE is deposited above the protective layer Cap.

In a magnetic tunnel junction of BS-pMTJ type according to the invention, the pinning layer may be constituted of a multilayer nE according to the invention, for example of $(FM/I/X)_n$ type, namely n repetitions of the stack FM/I/X or stack E according to the invention.

The hard layer HL may be constituted of a single multilayer of $(FM/X)_m$ type, with m and n being adjusted while taking into account the thicknesses of the layers FM in the two multilayers nE and HL to minimise the parasitic field exerted by the synthetic antiferromagnetic layer pSAF on the storage layer SL. Alternatively, the hard layer may also be constituted of a multilayer according to the invention of $(FM/I/X)_n$ type. Indeed, the use of a multilayer according to the invention for the hard layer makes it possible to increase the perpendicular magnetic anisotropy.

Alternatively the hard layer HL may be made of a "bulk" material having perpendicular magnetic anisotropy. Examples of such materials are alloys having a $L1_0$ type symmetry such as Fe—Pt, Fe—Pd and Co—Pt. Alternatively, it is possible to use materials having a $L1_1$ symmetry such as CoPt, CoPd or Co—Ni—Pt.

The hard layer HL may also be produced by using an alloy of a rare earth and a transition metal RE-TM. Among the rare earths, an element in the group formed by Tb, Dy, Ho, Er or a mixture of these elements could particularly be chosen. Transition metal is taken to mean an element such as Fe, Co or a mixture of these elements. Alternatively a Heusler type alloy with perpendicular anisotropy may be used, for example $Mn_{2.7}Co_{0.3}Ga$.

The hard layer HL and the reference layer RL are antiferromagnetically coupled by a coupling layer AF, by RKKY interaction. The coupling layer AF may be made of Ru, Re, Rh, Ir, Os or a mixture of these elements.

The tunnel barrier TB is made of MgO. However other metal oxides may also be used, such as $AlO_x$, $TaO_x$, $TiO_2$, $HfO_x$, $ZrO_x$, $GaO_x$, $SrTiO_3$.

Figure 4:
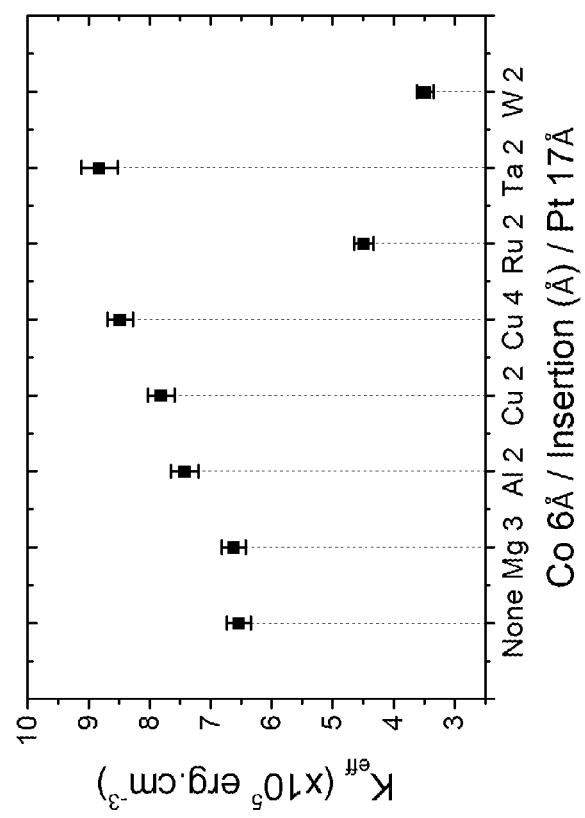
FIG. 4 shows the perpendicular magnetic anisotropy for magnetic stacks according to the invention having different insertion layers.

FIG. 4 shows the perpendicular magnetic anisotropy Keff of a multilayer nE according to the invention formed by the repetition of five magnetic stacks E according to the invention.

Each of the five stacks includes:
a first ferromagnetic layer FM of the first element E1 made of Co and having a thickness of 0.6 nm;
a second layer I of the first element E1 made of refractory metal material, each point of the graph in FIG. 4 corresponding to a different material;
a second layer X made of Pt and having a thickness of 1.7 nm.

In other words, the multilayer nE studied in FIG. 4 has the structure $(Co/I/Pt)_5$.

The five stacks are inserted into the upper part of a magnetic tunnel junction MTJ1 as illustrated in FIG. 3. The magnetic tunnel junction has been subjected to an annealing at 400° C.

The graph of FIG. 4 shows on the Y-axis the perpendicular magnetic anisotropy and on the X-axis the different materials chosen for the insertion layer I, as well as the thickness in Å of the insertion layer I. Each point of the graph in FIG. 4 represents the perpendicular magnetic anisotropy of a magnetic stack of Sub/Ta Adhesion layer/CoFeB Polarisation layer/MgO Tunnel barrier/FeCoB Layer/Texture breaking layer TBL/(Co/I/Pt)$_5$/Protective layer Cap type.

As is known to those skilled in the art, Keff is calculated from the surface comprised between the hysteresis curves M(H) measured respectively with the field applied perpendicularly to the plane of the layers and parallel to the plane of the layers. Hysteresis curve M(H) is taken to mean a measurement of the magnetisation M of the layers as a function of an applied external magnetic field H.

Figures 5A, 5B:
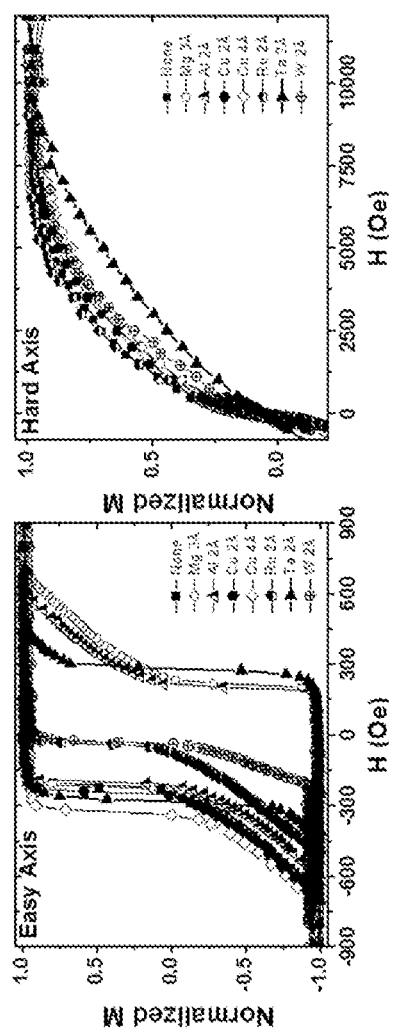
FIGS. 5a and 5b show the magnetisation curves measured for the stacks of which the perpendicular magnetic anisotropy is shown in FIG. 4.

The magnetisation curve M(H) relative to magnetisation perpendicular to the plane of the layers is illustrated in FIG. 5a. The magnetisation curve M(H) relative to magnetisation parallel to the plane of the layers is illustrated in FIG. 5b.

The graph of FIG. 4 shows that the perpendicular magnetic anisotropy Keff measured in the presence of an insertion layer made of Al, Cu or Ta is higher than that measured without insertion layer. In particular, the use of the refractory metal Ta gives the highest perpendicular magnetic anisotropy Keff.

The perpendicular magnetic anisotropy per volume unit Keff for a multilayer of (Co/I/Pt)$_n$ type may be calculated thanks to the following equation:

$$K_{eff} = \frac{K_{FeCoB}}{t_{FeCoB}} + (n-1)\frac{K_{Pt-Co}}{t_{Co-Pt}} + n\frac{K_{Co-I-Pt}}{t_{Co-Pt}} - 2\pi M_s^2$$

In this equation, in CGS units:

n is the number of superimposed stacks (Co/I/Pt);

$K_{Pt-Co}$ and $K_{Co-I-Pt}$ are the interface anisotropy constants at the Pt—Co and Co—I—Pt interfaces respectively; these constants are expressed in energy surface density;

$K_{FeCoB}$ is the interface anisotropy at the interface between MgO and FeCoB;

$M_s$ is the saturation magnetisation;

$t_{Co-Pt}$ is the total thickness of the Pt and Co layers.

The high value of Keff obtained for a layer I made of Cu is explained by the low miscibility of Cu with Co, as has been explained in the document FR 2976396.

However, the use of a Ta insertion layer increases later the perpendicular magnetic anisotropy, as is illustrated in FIG. 4. This is explained by the great rigidity of the refractory element Ta and the presence of very strong chemical bonds which prevent the creation of surface defects during the deposition of the layer made of heavy metal for example Pt.

FIG. 5a shows that the perpendicular magnetisation curve M(H) of the multilayer including a Ta layer has more abrupt transitions than the curve relative to a multilayer including a layer made of Cu or another non-refractory metal. In addition, FIG. 5b shows that the planar magnetisation curve M(H) relative to the stack including a Ta layer is almost linear. Such a linear behaviour of M(H) when the field is applied perpendicularly to the easy axis of magnetisation suggests that the anisotropy is of uniaxial character (second order anisotropy) as is known to those skilled in the art. On the other hand, for the other materials used, the curves M(H) measured with the field applied in the plane of the layers have a pronounced curvature. This suggests that the perpendicular anisotropy has anisotropy terms of higher order than the uniaxial order (in particular fourth order anisotropy terms).

Figure 6:
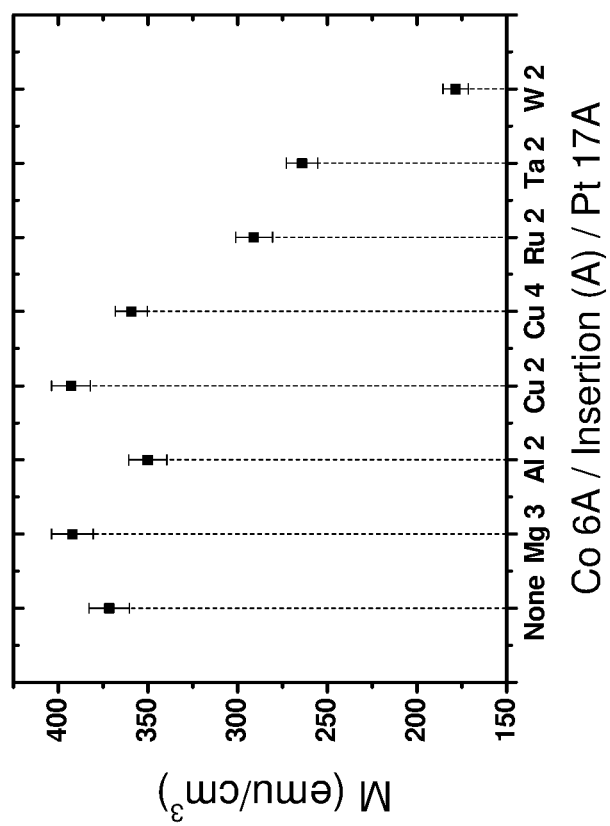
FIG. 6 shows the saturation magnetisation of the magnetic stacks of which the perpendicular magnetic anisotropy is shown in FIG. 4.

According to the equation given above, the perpendicular magnetic anisotropy Keff increases when the demagnetising energy $2\pi M_s^2$ is low. FIG. 6 shows the saturation magnetisation Ms for different insertion layers I in a multilayer of Co/I/Pt type. It appears that for an insertion layer I made of Ta, a contribution to the high Keff value is due to the reduction in the saturation magnetisation Ms.

The four technical effects obtained by adding an insertion layer I between a first ferromagnetic layer FM of the first element E1 and a second layer X of the magnetic stack E according to the invention may be summarised as:

mixing between the atoms of the first element E1 and the atoms of the second metal layer X is reduced;

reduction in the magnetisation of the stack E;

smoothing of the interface between the first element E1 and the second metal layer X.

increase in the structural stability of the whole of the stack E during potential annealings at high temperature such as 400° C. thanks to the mechanical rigidification introduced by the insertion of the refractory layer I.

These technical effects are also present when the first magnetic element is a monolayer including an alloy of one or more materials taken from the first group of materials and of a refractory metal.

These technical effects make it possible to obtain higher perpendicular magnetic anisotropy than in known stacks.

It is important to note that if the order of the layers is reversed and the ferromagnetic layer FM is deposited above the second layer X, the introduction of an insertion layer I above the layer X would reduce the perpendicular magnetic anisotropy Keff. For this reason the technical effects mentioned above are also found in the case of a multilayer nE obtained by superposition of several magnetic stacks E.

Figure 7:
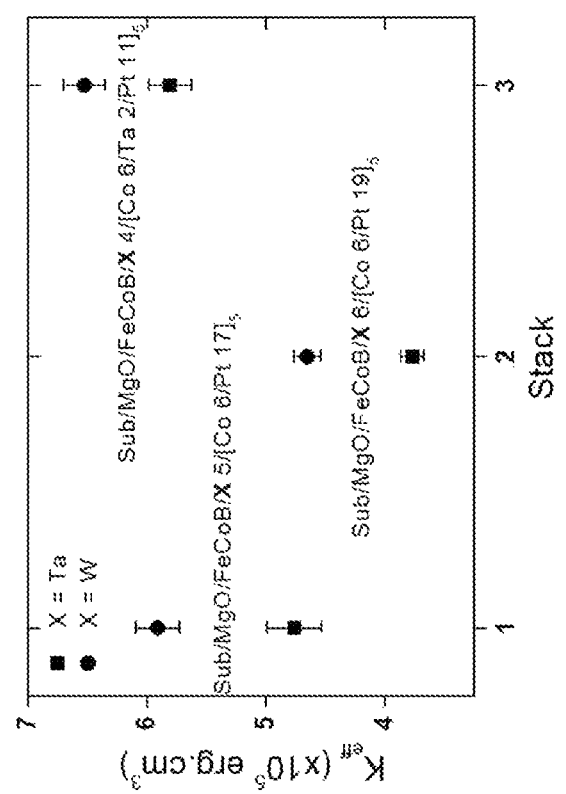
FIG. 7 shows the perpendicular magnetic anisotropy for different types of magnetic stacks according to the invention.

The texture breaking layer TBL also plays a role in the increase of perpendicular magnetic anisotropy. FIG. 7 shows the perpendicular magnetic anisotropy Keff measured for three different types of stack, each stack being produced in two alternatives: an alternative with a texture breaking layer made of Ta and an alternative with a texture breaking layer made of W.

The graph of FIG. 7 clearly shows that a texture breaking layer made of W systematically comprises higher Keff values.

Other possible materials for the texture breaking layer TBL are W, Mo, Hf, Zr, Nb.

Advantageously, the multilayer nE according to the invention may be used to produce a magnetic tunnel junction with perpendicular magnetisation MTJ1 according to the invention. The multilayer nE makes it possible to obtain high perpendicular magnetic anisotropy, even in the absence of a seed layer S having a predetermined symmetry.

Figure 8:
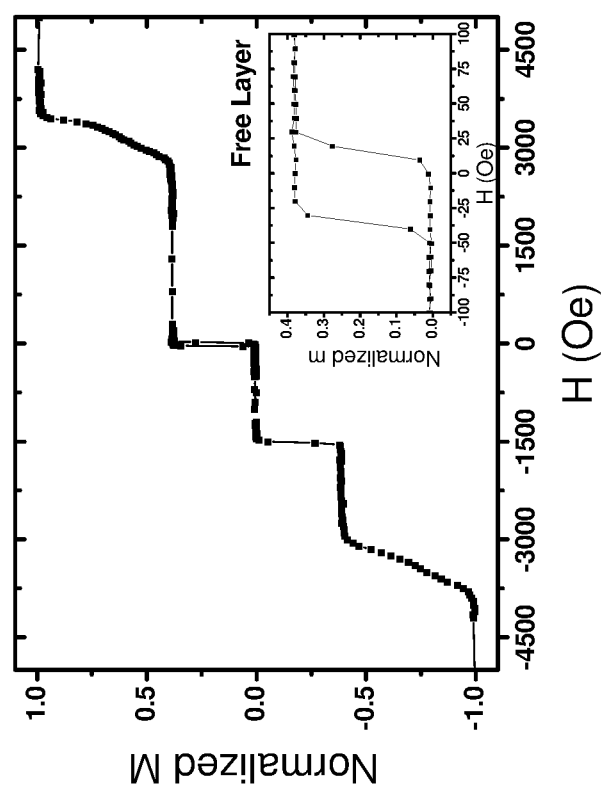
FIG. 8 shows the magnetisation curve of a magnetic tunnel junction according to the invention.

FIG. 8 shows the magnetisation curve M as a function of the external magnetic field H applied for a magnetic tunnel junction of BS-pMTJ type. In particular, the magnetic tunnel junction studied in FIG. 8 is of the type illustrated in FIG. 3b, in which the pinning layer comprised in the reference layer RL is a multilayer nE of (FM/X/I)$_n$ type according to the invention. Starting with a high positive value of H and progressively reducing H, the reversal of the magnetisation of the reference layer is observed for H=3 kOe. Successively the reversal of the magnetisation of the storage layer is observed for a slightly negative value of H. For a field H=−1.5 kOe the simultaneous reversal of the magnetisation of the reference layer and of the hard layer is observed. The magnetisation of the reference layer is oriented along the negative field H for H=−3.35 kOe. The insert in FIG. 8 shows in detail the reversal of the magnetisation of the storage layer SL for an applied magnetic field H close to zero.

FIGS. 9a to 9d show memory points with three terminals for a magnetic random access memory cell of "spin-orbit torque" or SOT-MRAM type. These memory points may also be used for a racetrack type memory. These memory points are obtained from a BS-pMTJ type magnetic tunnel junction according to the invention.

The device of FIG. 9a includes:
- a top electrode TE placed above a protective layer Cap of the tunnel junction;
- a hard layer HL;
- an antiferromagnetic coupling layer AF;
- a reference layer RL including a multilayer nE according to the invention, a texture breaking layer TBL, a spin polarisation layer PL;
- a tunnel barrier TB;
- a storage layer SL;
- a conductive metal line ML placed below the storage layer SL;
- a substrate layer Sub placed below the metal line ML;
- a first terminal T1 in contact with the top electrode;
- a second T2 and a third T3 terminal in contact with the metal line.

Unlike STT-MRAM type magnetic memories, which include two terminals, SOT-MRAM type memories include three or four terminals making it possible to separate the reading and writing current paths.

For a SOT-MRAM type memory the writing operation is carried out by a current pulse circulating in the metal line ML, which thus has the role of bottom electrode of the magnetic tunnel junction. The writing operation may exploit the Rashba effect or spin Hall effect (SHE). If the spin Hall effect is used, the metal line ML includes a heavy metal such as Pt, Ta or W. When a current of electrons flows through this metal line between the terminals T2 and T3, a spin current is injected by the metal line ML in the storage layer due to the spin Hall effect. This spin current exerts a spin-orbit torque on the magnetisation of the storage layer SL. If the torque exerted by the spin current is sufficiently high, the magnetisation of the storage layer SL is reversed. Thanks to the fact that the writing current does not traverse the tunnel barrier TB, the endurance to writing of a memory point of SOT-MRAM type is higher than that of a memory point of STT-MRAM type, especially for current pulses of duration less than several ns. Endurance to writing is taken to mean the number of writing cycles that the device can endure before its properties are degraded in particular due to the dielectric breakdown of the tunnel barrier.

By reversing the direction of the current flow between the terminals T2 and T3, the direction of the torque exerted on the magnetisation of the storage layer SL is also reversed. It is thus possible to reverse again the magnetisation of the storage layer SL.

The metal chosen for the metal line ML is a metal characterised by a high spin Hall angle, for example Ta, W, Pd, Pt, Au, Ir, Bi or an alloy of CuIr, CuBi, CuAu, AuW, IrMn type. The metal line ML may also be a bilayer or a multilayer formed by a stack of these materials.

Figure 9A:
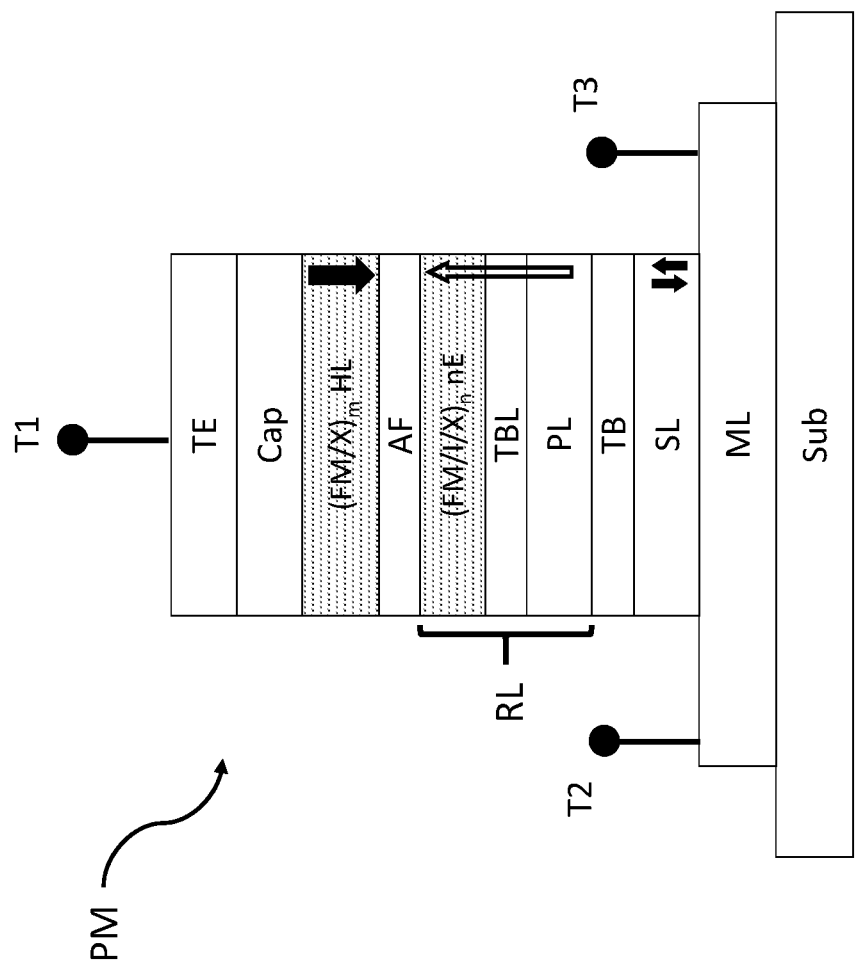
FIGS. 9a to 9d show different types of memory point according to the invention.

According to an embodiment of the device illustrated in FIG. 9a, the hard layer HL may also include a multilayer nE according to the invention.

The writing of the memory point illustrated in FIG. 9a is based on the use of current pulses circulating between the second T2 and the third T3 terminals. This method is suited to a memory point having two possible states of the storage layer SL.

Alternatively the reversal of the magnetisation of the storage layer SL may be carried out progressively by passing through a series of states having intermediate resistance values. This embodiment of the memory point according to the invention is illustrated in FIG. 9b.

Figure 9B:
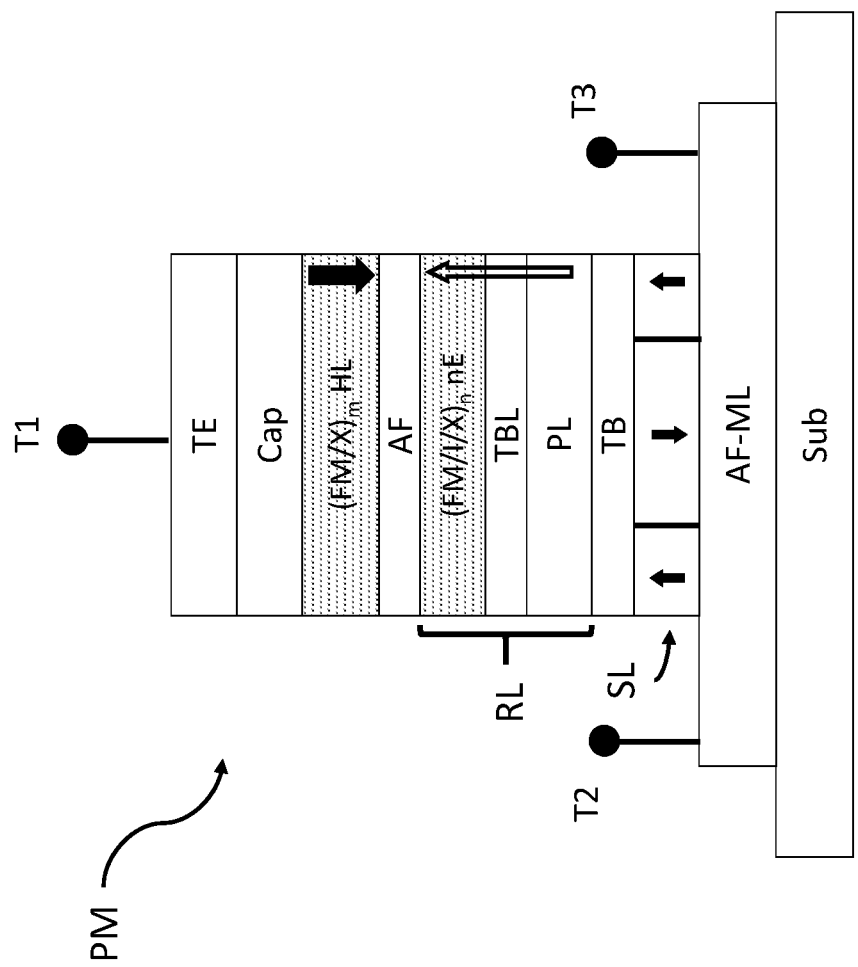

The device of FIG. 9b differs from the device of FIG. 9a in that the metal line is an antiferromagnetic metal line AF-ML. The material of which the antiferromagnetic metal line is constituted is for example IrMn or PtMn.

At the interface between the ferromagnetic material of which the metal line AF-ML is constituted and the tunnel barrier TB, the spin Hall effect is combined with an exchange anisotropy effect. Thanks to the combined effect of SHE and exchange anisotropy at the metal line/storage layer interface, the magnetisation of the storage layer is not reversed in an abrupt manner but by the creation of small reversed domains and by propagation of the walls of these domains. Exchange anisotropy also increases the coercive field of the storage layer and the reversal of the magnetisation become progressive. See for example S. Fukami et al. "Magnetization switching by spin-orbit torque in an antiferromagnet-ferromagnet bilayer system", published in Nature Materials, vol. 15, pages 535-541, 2016.

By controlling the amplitude and the duration of the current pulses circulating in the antiferromagnetic metal line AF-ML it is possible to obtain several states having intermediate magnetoresistance values. This type of device may also be used for memristor type applications.

Figure 9C:
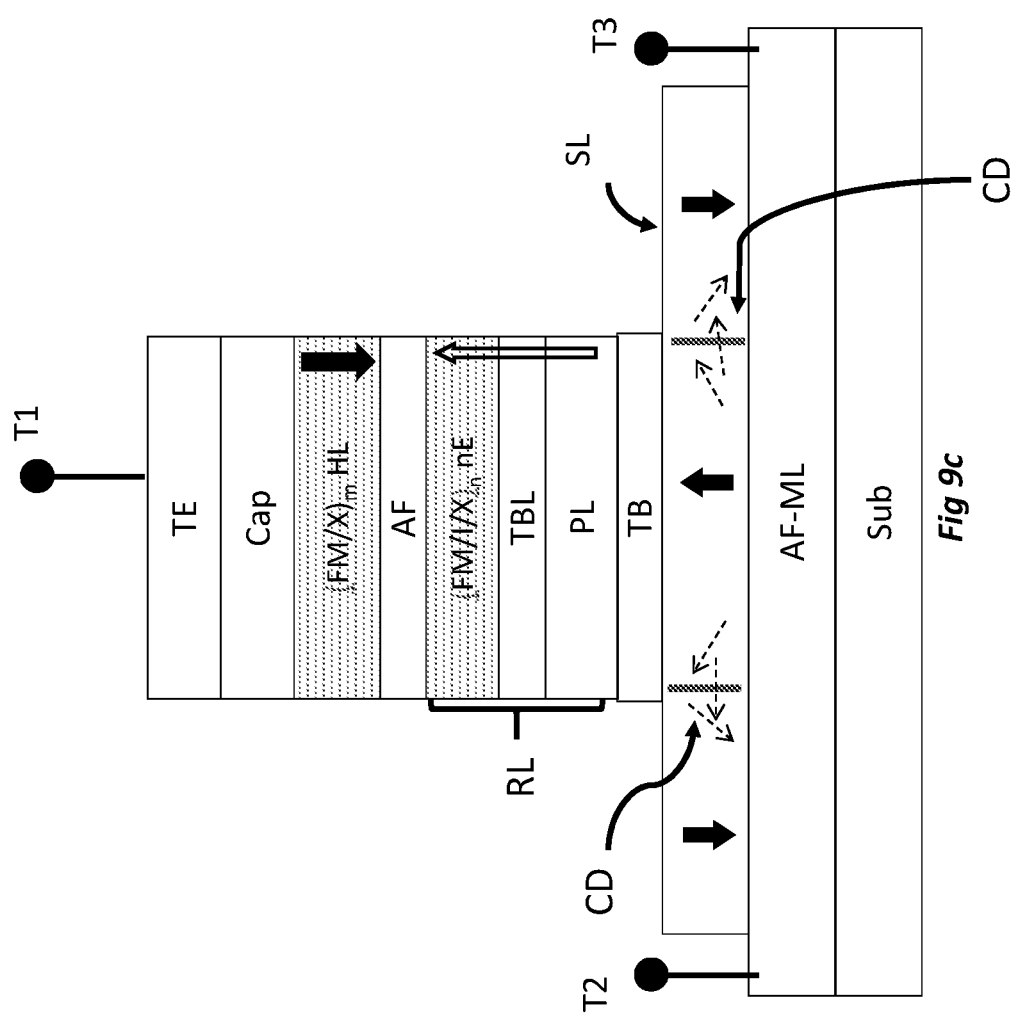
Figure 9D:
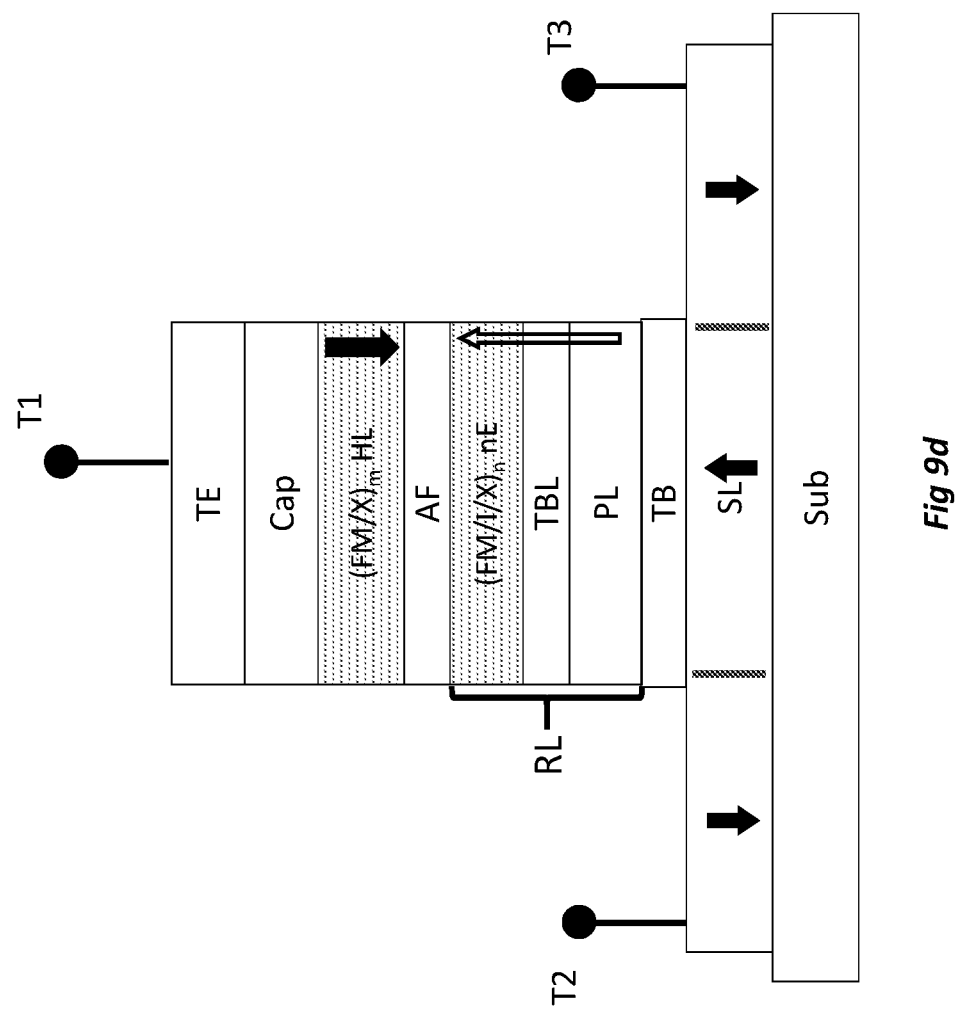

FIGS. 9c and 9d show memory points with three terminals for racetrack type memories. For a description of this type of memory, see for example "Magnetic domain-wall racetrack memory" of S. S. Parkin et al., published in Science, vol. 320.5873, pages 190-194, 2008.

The memory point of FIG. 9c has a structure similar to that of the device of FIG. 9b with the difference of the storage layer SL which has a lengthened shape according to a racetrack type geometry. The storage layer of the memory point of FIG. 9c has a larger surface than the tunnel barrier layer TB. The metal line AF-ML is made of antiferromagnetic material as in the device of FIG. 9b. The material chosen for the line AF-ML is based on heavy metal such as IrMn or PtMn such that it generates Dzyaloshinski Moriya interactions in the adjacent storage layer. As is known to those skilled in the art, this makes it possible to obtain in the layer SL chiral magnetic walls (CD) having all the same direction of rotation. The variation in the magnetisation of the storage layer SL is then achieved by translation of the domain walls along the racetrack. The translation of the walls is realised by spin Hall effect.

In the device of FIG. 9d, the metal line has been eliminated. The second T2 and third T3 terminals are directly connected to the storage layer SL. The variation in magnetisation of the storage layer SL takes place by translation of the walls of the domains along the racetrack. The translation of the walls of the domains takes place by spin transfer as in the device of FIG. 9b.

In the devices of FIGS. 9c and 9d the direction of translation of the walls depends on the polarity of the current pulses circulating between the second and third terminals.

Figure 10:
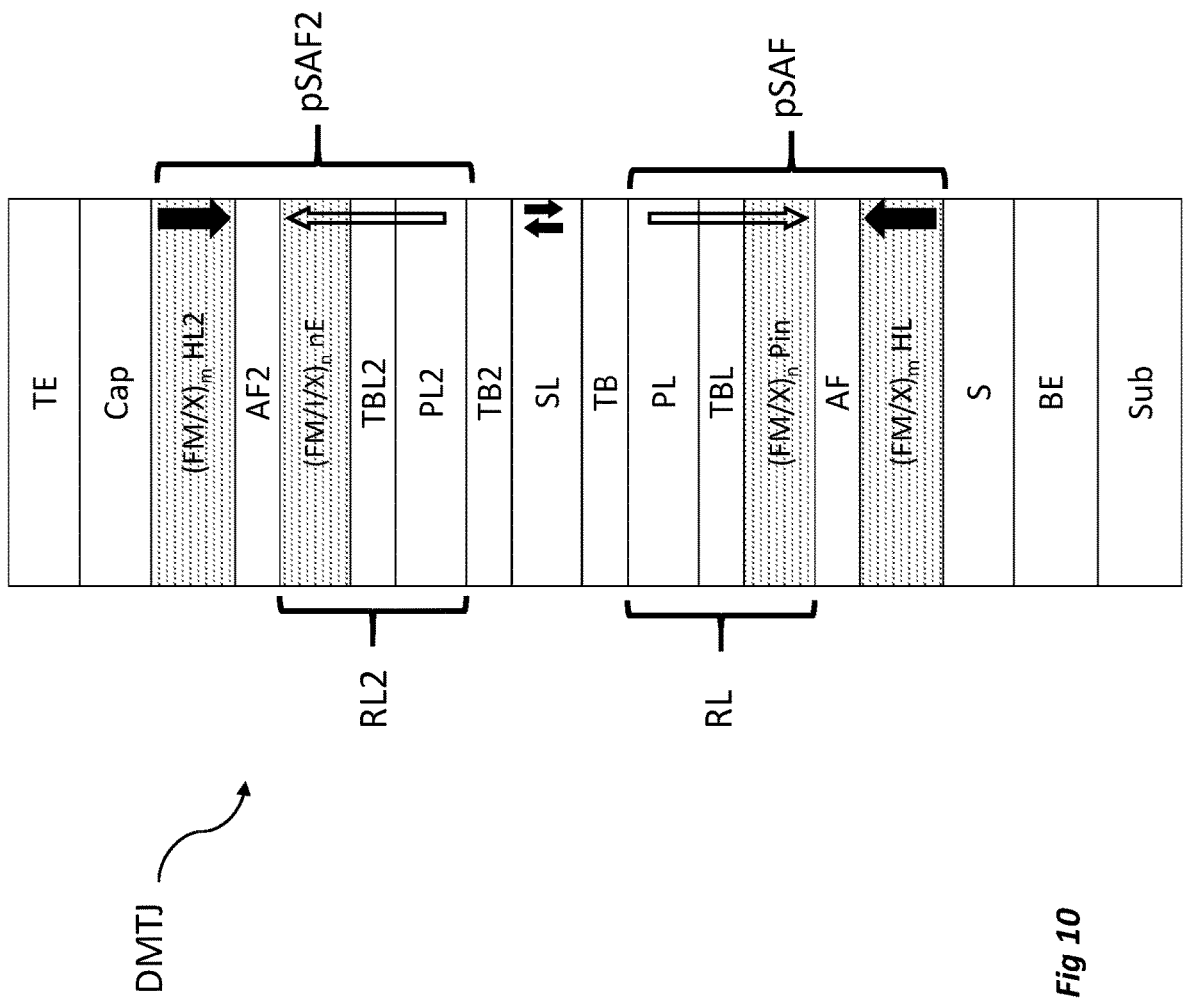
FIG. 10 shows a double magnetic tunnel junction including a composite storage layer and including at least one multilayer according to the invention.

FIG. 10 illustrates a double magnetic tunnel junction DMTJ including a multilayer nE according to the invention.

The double magnetic tunnel junction DMTJ according to the invention includes:
- a substrate layer Sub;
- a bottom electrode BE;
- a seed layer S;
- a hard layer HL;
- an antiferromagnetic coupling layer AF;
- a first pinning layer Pin;
- a first textile breaking layer TBL;
- a first spin polarisation layer PL;
- a first tunnel barrier TB;
- a storage layer SL;
- a second tunnel barrier TB2;
- a second spin polarisation layer PL2;
- a second textile breaking layer TBL2;
- a multilayer according to the invention nE acting as second pinning layer;
- a second antiferromagnetic coupling layer AF2;
- a second hard layer HL2;
- a protective layer Cap;
- a top electrode TE.

The first reference layer RL is formed by the first pinning layer Pin, the first texture breaking layer TBL and the first spin polarisation layer PL. The first reference layer RL is coupled to the first hard layer HL by means of a first antiferromagnetic coupling layer AF to form a first synthetic antiferromagnetic layer pSAF with perpendicular magnetisation.

The second reference layer RL2 is formed by the second polarisation layer PL2, the second texture breaking layer TBL2 and a multilayer nE according to the invention acting as second pinning layer. The second reference layer RL2 is coupled to the second hard layer HL2 by means of a second antiferromagnetic coupling layer AF2 to form a second synthetic antiferromagnetic layer pSAF2 with perpendicular magnetisation.

The use of two synthetic ferromagnetic layers pSAF and pSAF2 makes it possible to reinforce the coercivity of the layers PL and PL2 and to reduce magnetostatic coupling between the reference layers and the storage layer SL.

The storage layer SL may be a composite layer including a ferromagnetic layer/non-magnetic layer/ferromagnetic layer stack in which the magnetisations of the two ferromagnetic layers are strongly coupled by the non-magnetic layer. The thickness of the non-magnetic layer determines the type of ferromagnetic or antiferromagnetic coupling between the two ferromagnetic layers. The non-magnetic coupling layer may be made of Ta, W or Mo with a thickness comprised between 0.1 nm and 1 nm.

Thanks to the presence of the two spin polarisation layers PL and PL2 of magnetisation oriented antiparallel with respect to each other, the spin transfer torque acting on the magnetisation of the storage layer SL is more efficient. In particular, the efficiency of the spin transfer torque is more than doubled compared to a magnetic tunnel junction of BS-pMTJ or TS-pMTJ type.

When the storage layer is a composite ferromagnetic layer, the magnetisation of the first reference layer must be oriented antiparallel to the magnetisation of the second reference layer to be able to obtain an efficient spin transfer effect (or Spin Transfer Torque STT). On the other hand, if the storage layer SL is a synthetic antiferromagnetic layer, that is to say including two ferromagnetic layers coupled in an antiferromagnetic manner, the magnetisation of the first reference layer RL must be parallel to the magnetisation of the second reference layer RL2 to maximise the spin transfer effect.

The parallel or antiparallel orientation of the two magnetisations may be obtained by producing hysteresis loops and by exploiting the difference between the coercive fields of the two reference layers.

According to the alternative of double magnetic tunnel junction DJTM illustrated in FIG. 10, the second pinning layer, placed above the storage layer SL, is produced by using the multilayer nE according to the invention and in particular a multilayer of $(FM/I/X)_n$ type. The first pinning layer Pin and the two hard layers HL and HL2 are produced using a standard multilayer of $(FM/X)_{n,m}$ type. In the configuration $(FM/X)_n$ for the hard layers, the layer FM is constituted of a material taken from the group of materials including: Co, CoFe, Fe, Ni or a mixture of these materials. The layer FM may also include a non-magnetic element such as Cr, V, B or Zr. The layer X is constituted of a material taken from the group of materials including: Pt, Pd, Ru, Au, Ir, Ni, NiCo, NiFe or a mixture of these materials.

According to an alternative of double magnetic tunnel junction DJTM, not represented, the hard layers HL and HL2 may be produced using a multilayer nE according to the invention of $(FM/I/X)_m$ type and the first pinning layer Pin may also be produced using a multilayer nE according to the invention of $(FM/I/X)_n$ type.

In all the alternatives of the double magnetic tunnel junction DMTJ according to the invention, the first and second tunnel barriers, TB and TB2, must have different resistance*surface products. Indeed the tunnel magnetoresistance of the first barrier is opposite to that of the second barrier. A difference between the two tunnel barriers is thus necessary in order that the effective magnetoresistance value is not less than that obtained for a single tunnel junction.

Figure 11:
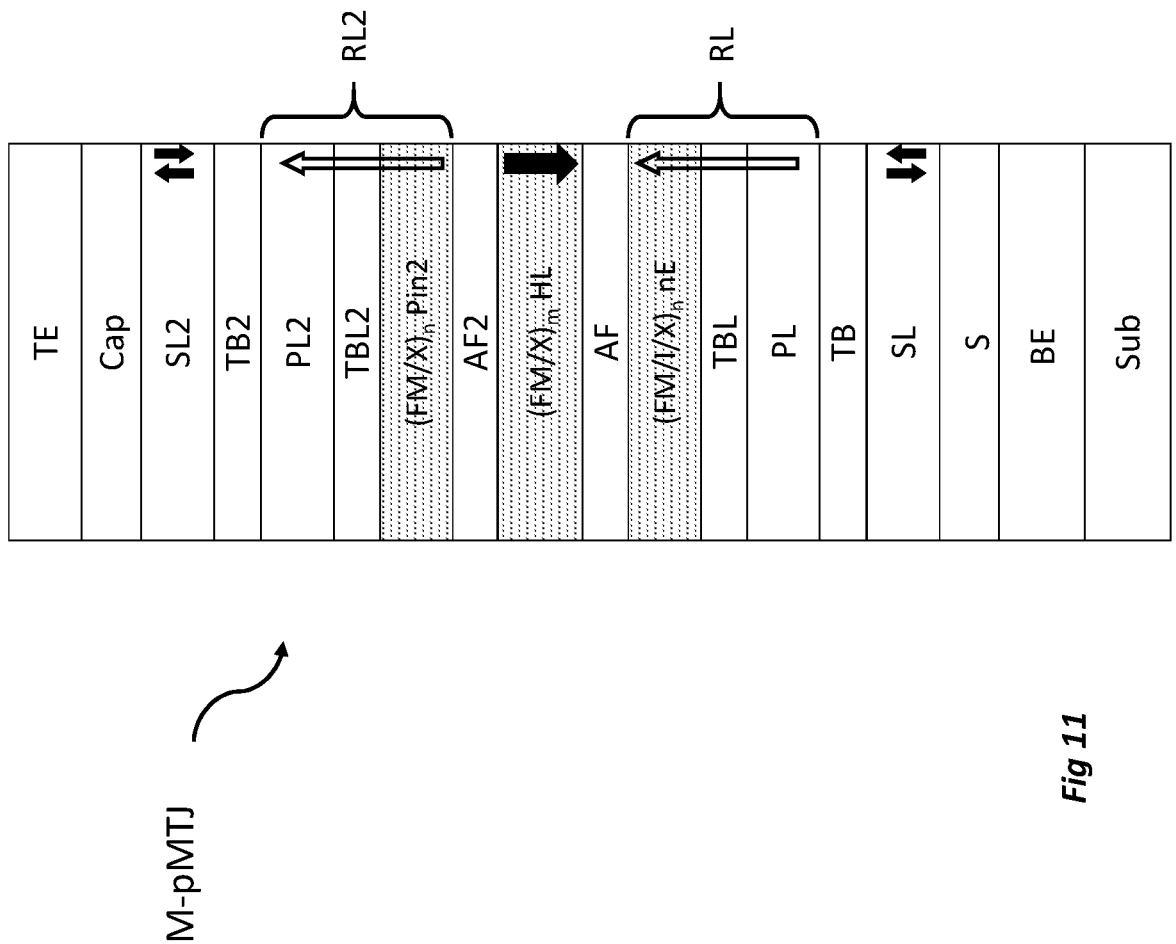
FIG. 11 shows a magnetic tunnel junction including two storage layers and at least one multilayer according to the invention.

FIG. 11 shows a magnetic tunnel junction with several levels M-pMTJ for the production of a memory point with a higher information density than a standard memory point.

The magnetic tunnel junction with several levels M-pMTJ of FIG. 11 includes:
- a substrate layer Sub;
- a bottom electrode BE;
- a seed layer S;
- a first storage layer SL;
- a first tunnel barrier TB;
- a first spin polarisation layer PL;
- a first texture breaking layer TBL;
- a first pinning layer produced using a multilayer nE according to the invention;
- a first antiferromagnetic coupling layer AF;
- a first hard layer HL;
- a second antiferromagnetic coupling layer AF2;
- a second pinning layer Pin2;
- a second texture breaking layer TBL2;
- a second spin polarisation layer PL2;
- a second tunnel barrier TB2;
- a second storage layer SL2;
- a protective layer Cap;
- a top electrode TE.

The first polarisation layer PL, the first texture breaking layer TBL and the multilayer according to the invention nE acting as first pinning layer constitute the first reference layer RL.

The second polarisation layer PL2, the second texture breaking layer TBL and the second pinning layer Pin2 constitute the second reference layer RL2.

The hard layer HL is antiferromagnetically coupled to the two reference layers RL and RL2.

According to an alternative of the device of FIG. 11, the second pinning layer Pin2 may also include a multilayer nE according to the invention.

The magnetic tunnel junction with several levels M-pMTJ includes two storage layers. The first storage layer SL is below the first tunnel barrier BT, the second storage layer SL2 is above the second tunnel barrier TB2. By choosing two tunnel barrier layers having two different values of their resistance*surface product, it is possible to obtain four resistance values corresponding to the four different configurations of the magnetisations of the storage layers. The four configurations correspond to the orientations parallel/parallel, parallel/antiparallel, antiparallel/parallel, antiparallel/antiparallel.

The critical reversal current of the magnetisation must be different for the two storage layers in order to be able to write selectively one or the other of the storage layers. During the writing of the storage layer having the highest coercive field, the storage layer having the lowest coercive field may also find itself with its magnetisation reversed. Thus after having written the hardest layer magnetically, it is necessary to write the layer having the lowest coercive field.

Figure 12:
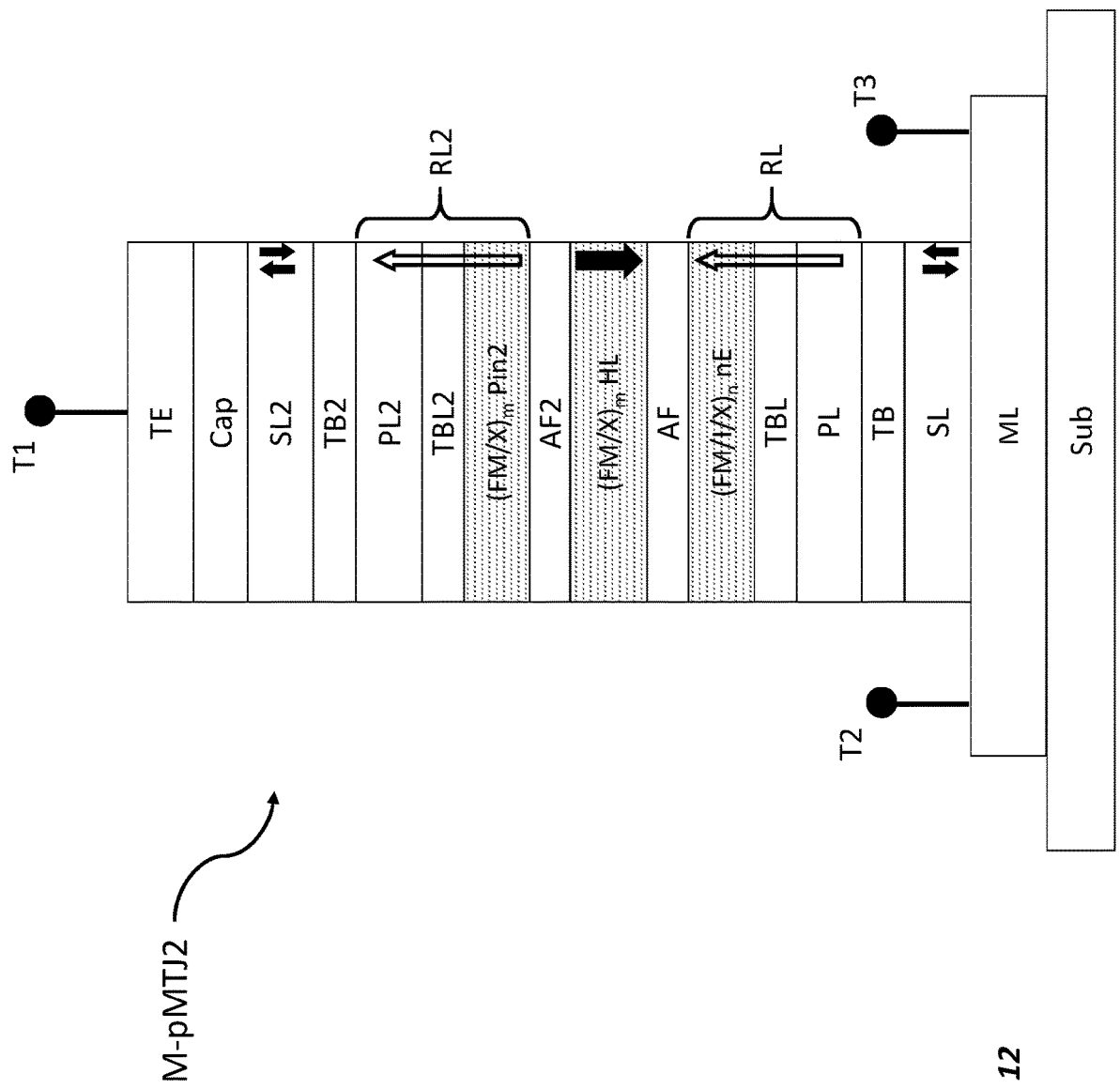
FIG. 12 shows a memory point with three terminals obtained from the double tunnel junction illustrated in FIG. 11.

FIG. 12 shows a memory point with three terminals for a memory cell with several levels M-pMTJ2 having two storage layers SL and SL2.

The magnetic tunnel junction with several levels M-pMTJ2 includes the following layers:
A substrate layer Sub;
A metal line ML including a material having a high spin Hall angle;
A second T2 and third T3 terminals connected to the metal line ML;
A first storage layer SL;
A first tunnel barrier TB;
A first texture breaking layer TBL;
A multilayer according to the invention nE having the role of first pinning layer;
A first antiferromagnetic coupling layer AF;
A hard layer HL;
A second antiferromagnetic coupling layer AF2;
A second pinning layer Pin2;
A second texture breaking layer TBL2;
A second spin polarisation layer PL2;
A second texture breaking layer TBL2;
A protective layer Cap;
A top electrode TE;
A first terminal connected to the top electrode TE.

The first polarisation layer PL, the first texture breaking layer TBL and the multilayer according to the invention nE constitute the first reference layer RL.

In the memory point for a memory cell with several levels M-pMTJ2, each storage layer may be written independently of the other.

When a current pulse circulates along the metal line ML between the terminals T2 and T3, a spin polarised current generated by spin Hall effect is injected into the first storage layer SL. This spin polarised current exerts a spin-orbit torque on the magnetisation of the storage layer which may be reversed if the torque is sufficient. To reverse the magnetisation in the opposite direction, it is necessary to reverse the direction of circulation of the current pulse along the metal line ML.

The writing of the second storage layer SL2 is carried out by spin transfer thanks to a current pulse circulating perpendicularly to the plane of the layers through the stack. To be able to carry out the operations of writing of the two storage layers SL and SL2 in an independent manner, the first storage layer SL has a coercive field higher than that of the second storage layer SL2. This makes it possible to leave unchanged the magnetisation of the first storage layer SL when the magnetisation of the second storage layer SL2 is reversed.

If on the other hand the coercive field of the first storage layer SL is lower than that of the second storage layer SL2, each antiparallel-parallel reversal of the magnetisation of the second storage layer SL2 will cause an antiparallel-parallel reversal of the first storage layer SL, if the latter was initially in the antiparallel state.

To resolve this problem it is necessary to write again the first storage layer SL, as has already been discussed also with reference to FIG. 11.

Figure 13:
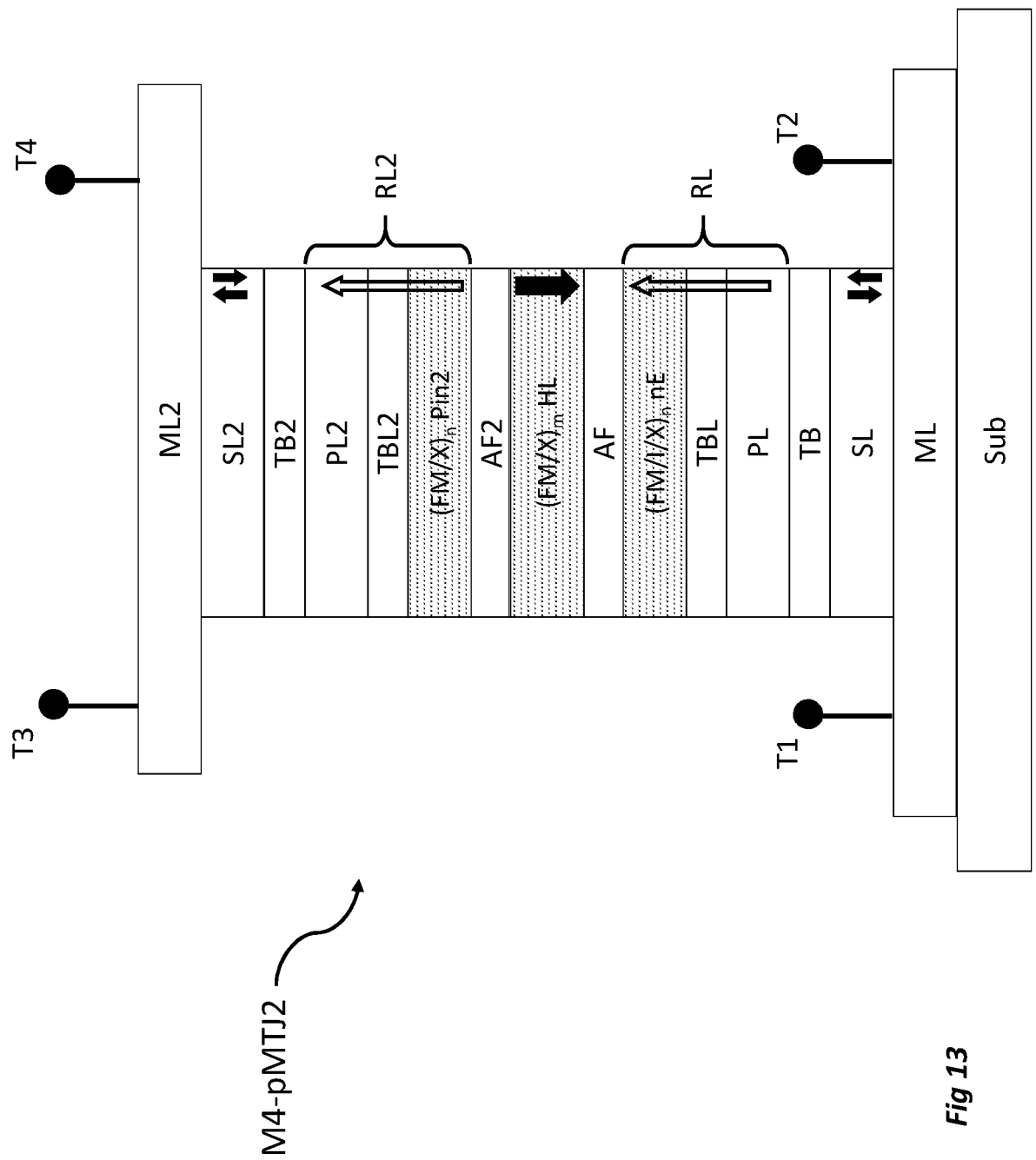
FIG. 13 shows a memory point with four terminals including at least one magnetic stack or a multilayer according to the invention.

The problem of double writing of the storage layer having the lowest coercive field is resolved by another memory point according to the invention and represented in FIG. 13.

FIG. 13 represents a memory point with four terminals for a memory cell with several levels M4-pMTJ.

The memory point with four terminals M4-pMTJ according to FIG. 13 includes:
A substrate layer Sub;
A first metal line ML including a material having a high spin Hall angle;
Two terminals T3 and T4 connected to the first metal line ML;
A first deposited storage layer SL in contact with the first metal line ML;
A first tunnel barrier TB;
A first polarisation layer PL;
A first texture breaking layer TBL;
A multilayer nE according to the invention having the role of first pinning layer;
A first antiferromagnetic coupling layer AF;
A hard layer HL;
A second antiferromagnetic coupling layer AF2;
A second pinning layer Pin2;
A second texture breaking layer TBL2;
A second polarisation layer PL2;
A second tunnel barrier TB2;
A second storage layer SL2;
A second metal line ML2 including a material having a high spin angle, the second metal line being deposited in contact with the second storage layer SL2;
Two terminals T1 and T2 placed in contact with the second metal line ML2.

The first spin polarisation layer PL, the first texture breaking layer TBL and the multilayer nE according to the invention acting as first pinning layer constitute a first reference layer RL.

The second pinning layer Pin2, the second texture breaking layer TBL2 and the second polarisation layer PL2 constitute a second reference layer RL2.

In the configuration illustrated in FIG. 13, the two storage layers SL and SL2 are written by spin-orbit torque. The reversal of the magnetisation of the first storage layer SL is achieved thanks to a current pulse circulating along the first metal line ML between the two terminals T3 and T4. In the same way, the writing of the second storage layer SL2 is achieved thanks to a current pulse circulating along the second metal line ML2 between the two terminals T1 and T2.

No writing error is possible in the configuration of FIG. 13 and this is so independently of the values of the coercive fields of the two storage layers SL and SL1.

The memory point with four terminals M4-pMTJ according to FIG. 13 has four distinct resistance states. Reading of the resistance value is possible using a vertical current, for example by choosing one of the terminals of the first metal line ML and one of the terminals of the second metal line ML2.

Alternatively, the writing of the two storage layers SL and SL2 may be carried out by nucleation of magnetic domains or by propagation of the walls of magnetic domains, as has been described in relation to FIG. 9b. In this case, the two metal lines ML and ML2 are constituted of an antiferromagnetic material having a high spin Hall angle. Examples of such a material are IrMn or PtMn. These writing methods are applicable not only for memory points with several levels of SOT-MRAM type but also for memristor type devices.

Figure 14:
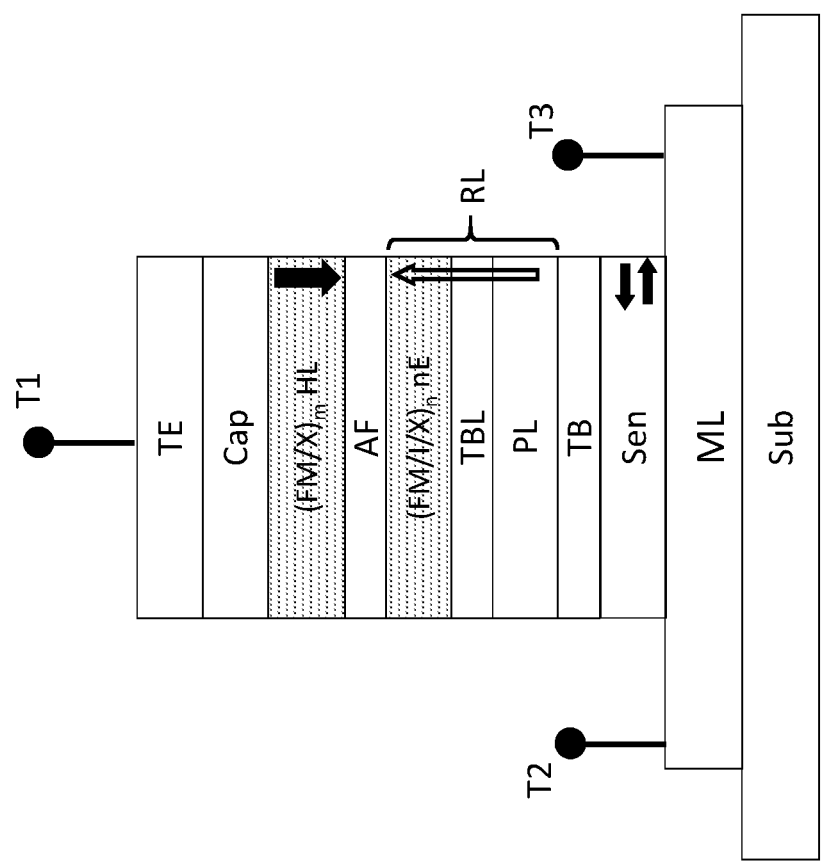
FIG. 14 shows an example of temperature and magnetic field sensor including a multilayer according to the invention.

FIG. 14 illustrates a temperature and magnetic field sensor including a multilayer nE according to the invention.

The sensor illustrated in FIG. 14 includes:
A substrate layer Sub;
A metal line ML, typically made of Pt;
A detection layer Sen placed above and in contact with the metal line ML;
A tunnel barrier TB;
A spin polarisation layer PL;
A texture breaking layer TBL;
A multilayer nE according to the invention having the role of pinning layer;
An antiferromagnetic coupling layer AF;
A hard layer HL;
A protective layer Cap;
A top electrode TE.

A first electrical terminal T1 is connected to the top electrode. A second T2 and a third T3 terminal are connected to the metal line ML.

The polarisation layer PL, the texture breaking layer TBL and the multilayer nE according to the invention form a reference layer RL.

According to an alternative, the hard layer HL may also include a multilayer nE according to the invention of (FM/X/I)$_n$ type.

The detection layer has magnetisation in the plane in the absence of applied external magnetic field. The magnetic field to measure is oriented along the direction normal to the layers. Under the action of the magnetic field to measure, the magnetisation of the detection layer is drawn out-of-plane and is oriented parallel or antiparallel to the magnetisation of the reference layer along the direction of the magnetic field to measure. It is thus possible to measure a resistance that depends on the magnetic field to measure on account of the tunnel magnetoresistance of the stack.

To read the resistance value, it is possible to measure the electric voltage between the first terminal T1 and one of the terminals T2 or T3 of the metal line ML by making a current of determined intensity circulate through the stack between the terminals T1 and T2 or T3.

The detection layer may be a single layer or a stack of layers forming a synthetic antiferromagnetic layer. Advantageously, in the second case it is possible to reduce the parasitic field of magnetostatic origin between the detection layer and the pinning layers.

The perpendicular magnetic susceptibility of the detection layer may be modified by varying the thickness of the detection layer, which makes it possible to modify the sensitivity of the magnetic field sensor.

Generally speaking, the resistance of the layers, the magnetoresistance and the sensitivity of the sensor according to FIG. 14 depend on the temperature. It is thus necessary to measure the temperature of the sensor to be able to work back to the value of the magnetic field starting from a measured magnetoresistance value. The temperature may be measured by measuring the resistance of the metal line ML between the terminals T2 and T3. This measurement of the resistance of the line ML must be carried out at sufficiently low current such that the influence of a potential spin-orbit torque induced by the circulation of the current in the line ML on the magnetisation of the layer Sen does not perturb the reading of the magnetoresistance signal between the terminals T1 and T2 or T3. In practice, it may be preferable to carry out the two measurements of electrical resistance between the terminals T1 and T2 or T3 (measurement of the magnetic field) and between the terminals T2 and T3 (measurement of the temperature) at two separate and consecutive time intervals.

Figure 15:
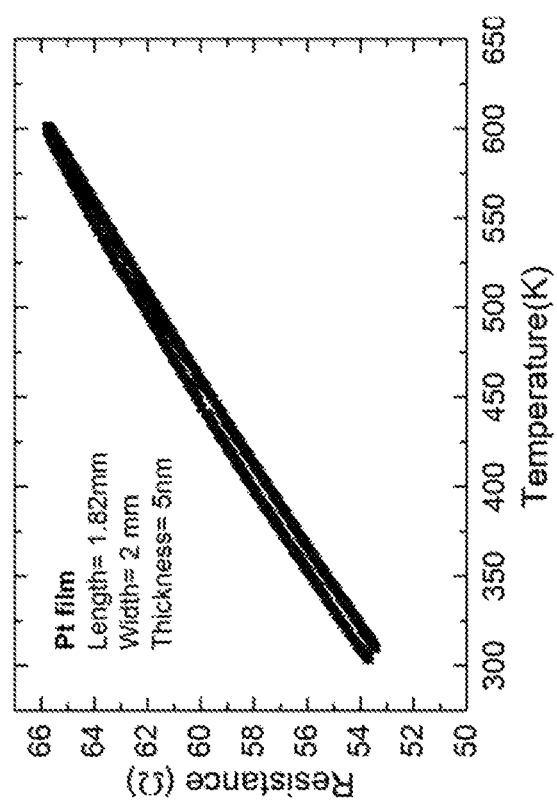
FIG. 15 shows the electrical resistance measured at the terminals of a Pt metal line as a function of temperature.

By choosing a metal such as Pt, the measured resistance depends quasi-linearly on the temperature, as is illustrated in FIG. 15.

The device according to FIG. 14 may thus be used to measure the temperature and an external magnetic field perpendicular to the plane of the layers.

The invention claimed is:

1. Multilayer including at least a first and a second magnetic stack, the multilayer having an out-of-plane magnetisation, each of said first and second magnetic stacks including:
a first element including a ferromagnetic layer having a planar magnetic anisotropy:
a second element including a metal layer able to confer on the assembly formed by the first and the second elements a magnetic anisotropy perpendicular to the plane of the layers, wherein the first element further includes a refractory metal material, the second element being arranged on the first element;
the first element of the second magnetic stack being arranged on the metal layer of the second element of the first magnetic stack.

2. The multilayer according to claim 1, wherein
the ferromagnetic layer of the first element includes one or more materials taken from a first group of materials, said first group of materials being constituted of the following materials: cobalt, iron, nickel and magnetic alloys based on these materials; and/or
the metal layer of the second element includes one or more materials taken from a second group of materials, said second group of materials being constituted of the following materials: platinum, gold, iridium, palladium, nickel, NiCo, NiFe, NiFeCo and alloys based on these materials.

3. The multilayer according to claim 2, wherein the ferromagnetic layer of the first element includes an alloy based on one or more materials taken from the first group of materials and on the refractory metal material.

4. The multilayer according to claim 2, wherein the first element includes a first layer of the first element and a second layer of the first element, the first layer of the first element including one or more materials taken from the first group of materials and the second layer of the first magnetic element being constituted of the refractory metal material.

5. The multilayer according to claim 4, wherein the second layer of the first element has a thickness comprised between 0.1 and 0.6 nm.

6. The multilayer according to claim 5, wherein the thickness is comprised between 0.2 and 0.4 nm.

7. The multilayer according to claim 1, wherein the refractory metal material is taken from the following group: tantalum, tungsten, molybdenum, ruthenium, zirconium, vanadium, niobium.

8. The multilayer according to claim 1, wherein the refractory metal material has a melting temperature above 1600° C., said melting temperature being measured at the pressure of 1 bar.

9. Magnetic tunnel junction including:
a first magnetic multilayer corresponding to a reference layer;
a second magnetic multilayer corresponding to a storage layer;
a tunnel barrier layer which separates the reference layer and the storage layer;
wherein the reference layer includes a multilayer according to claim 1.

10. The magnetic tunnel junction according to claim 9, wherein the tunnel barrier layer is placed above the storage layer.

11. Memory point with two or three terminals including:
a top electrode in contact with a first terminal;
a magnetic multilayer corresponding to a reference layer including at least one multilayer according to claim 1;
a magnetic multilayer corresponding to a storage layer;
a tunnel barrier layer separating the reference layer and the storage layer;
a second terminal in electrical contact with the storage layer or a metal line electrically connected to second and third terminals, placed below the storage layer and in electrical contact with the storage layer.

12. The memory point according to claim 11, wherein the conductive metal line is a conductive antiferromagnetic metal line.

13. The memory point according to claim 11, wherein the storage layer has a racetrack type geometry.

14. Memory point with three terminals including:
a top electrode connected to a first terminal;
a first magnetic multilayer corresponding to a reference layer including at least one multilayer according to claim 1;
a magnetic multilayer corresponding to a storage layer, a second and a third terminal being connected to said storage layer;
a tunnel barrier layer separating the reference layer and the storage layer.

15. Double magnetic tunnel junction including:
a first magnetic multilayer corresponding to a first reference layer;
a second magnetic multilayer corresponding to a storage layer;
a third magnetic multilayer corresponding to a second reference layer including a multilayer according to claim 1;
a first tunnel barrier layer separating the first reference layer and the storage layer;
a second tunnel barrier layer separating the second reference layer and the storage layer.

16. Magnetic tunnel junction for a memory cell with several levels including:
a first magnetic multilayer corresponding to a first storage layer;
a second magnetic multilayer corresponding to a first reference layer including a multilayer according to claim 1;
a first tunnel barrier layer separating the first reference layer and the first storage layer;
a third magnetic multilayer corresponding to a second reference layer;
a fourth magnetic multilayer corresponding to a second storage layer;
a second tunnel barrier layer separating the second reference layer and the second storage layer.

17. Memory point with three terminals for a memory cell with several levels including:
a metal line connected to a second and a third terminal;
a first magnetic multilayer corresponding to a first storage layer placed above the metal line and in contact with said metal line;
a second magnetic multilayer corresponding to a first reference layer including a multilayer according to claim 1;
a third magnetic multilayer corresponding to a second reference layer;
a fourth magnetic multilayer corresponding to a second storage layer.
a top electrode connected to a first terminal.

18. Memory point with four terminals for a memory cell with several levels including:
a first metal line connected to a first and to a second terminal;
a first magnetic multilayer corresponding to a first storage layer placed above the first metal line and in contact with said first metal line;
a second magnetic multilayer corresponding to a first reference layer including a multilayer according to claim 1;
a first tunnel barrier layer separating the first storage layer and the first reference layer;
a third magnetic multilayer corresponding to a second reference layer;
a fourth magnetic multilayer corresponding to a second storage layer;
a second metal line connected to a third and to a fourth terminal, said second metal line being placed above the second storage layer and in contact with said second storage layer;
a second tunnel barrier layer separating the second storage layer and the second reference layer.

19. Sensor for the measurement of an applied magnetic field including:
a top electrode connected to a first terminal;
a first magnetic multilayer corresponding to a reference layer including a multilayer according to claim 1;
a second magnetic multilayer corresponding to a detection layer having a magnetisation oriented parallel to the plane of the layers in the absence of applied magnetic field;
a tunnel barrier layer separating the detection layer and the reference layer;
at least one second terminal electrically connected to the detection layer.

20. The sensor for the measurement of an applied magnetic field according to claim 19, wherein the sensor is configured to measure the temperature and wherein the sensor includes a metal line connected to a second and to a third terminal, said metal line being below the detection layer and in electrical contact with said detection layer.

* * * * *